United States Patent
Hikosaka et al.

(10) Patent No.: US 7,338,815 B2
(45) Date of Patent: Mar. 4, 2008

(54) SEMICONDUCTOR DEVICE MANUFACTURING METHOD

(75) Inventors: Yukinobu Hikosaka, Kawasaki (JP); Hirotoshi Tachibana, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 156 days.

(21) Appl. No.: 11/235,362

(22) Filed: Sep. 27, 2005

(65) Prior Publication Data
US 2006/0281248 A1    Dec. 14, 2006

(30) Foreign Application Priority Data
Jun. 8, 2005 (JP) ............... 2005-168603

(51) Int. Cl.
H01L 21/00 (2006.01)
H01L 21/336 (2006.01)
H01L 21/8234 (2006.01)
H01L 21/8238 (2006.01)
H01L 21/8244 (2006.01)
H01L 21/20 (2006.01)

(52) U.S. Cl. ............. 438/3; 438/238; 438/197; 438/201; 438/396; 438/482; 438/486; 438/509; 438/630; 438/253; 438/239; 257/E21.008; 257/E21.208; 257/E21.296

(58) Field of Classification Search ............ 438/3, 438/197, 201, 238, 239, 630, 396, 482, 486, 438/509, 253; 257/E21.008, E21.208, E21.296
See application file for complete search history.

(56) References Cited
U.S. PATENT DOCUMENTS
2006/0079074 A1* 4/2006 Jung et al. ............... 438/581

FOREIGN PATENT DOCUMENTS
JP 6-21333 1/1994
JP 2003-303786 10/2003
JP 2003-347311 12/2003

* cited by examiner

Primary Examiner—Michael Lebentritt
Assistant Examiner—Mohsen Ahmadi
(74) Attorney, Agent, or Firm—Westerman, Hattori, Daniels & Adrian, LLP.

(57) ABSTRACT

A semiconductor device manufacturing method, includes a step of forming refractory metal silicide layers 13a to 13c in a partial area of a semiconductor substrate 10, a step of forming an interlayer insulating film 21 on the refractory metal silicide layers 13a to 13c, a step of forming a first conductive film 31, a ferroelectric film 32, and a second conductive film 33 in sequence on the interlayer insulating film 21, a step of forming a capacitor Q consisting of a lower electrode 31a, a capacitor dielectric film 32a, and an upper electrode 33a by patterning the first conductive film 33, the ferroelectric film 32, and the second conductive film 31, and a step of performing an annealing for an annealing time to suppress a agglomeration area of the refractory metal silicide layers 13a to 13c within an upper limit area.

17 Claims, 19 Drawing Sheets

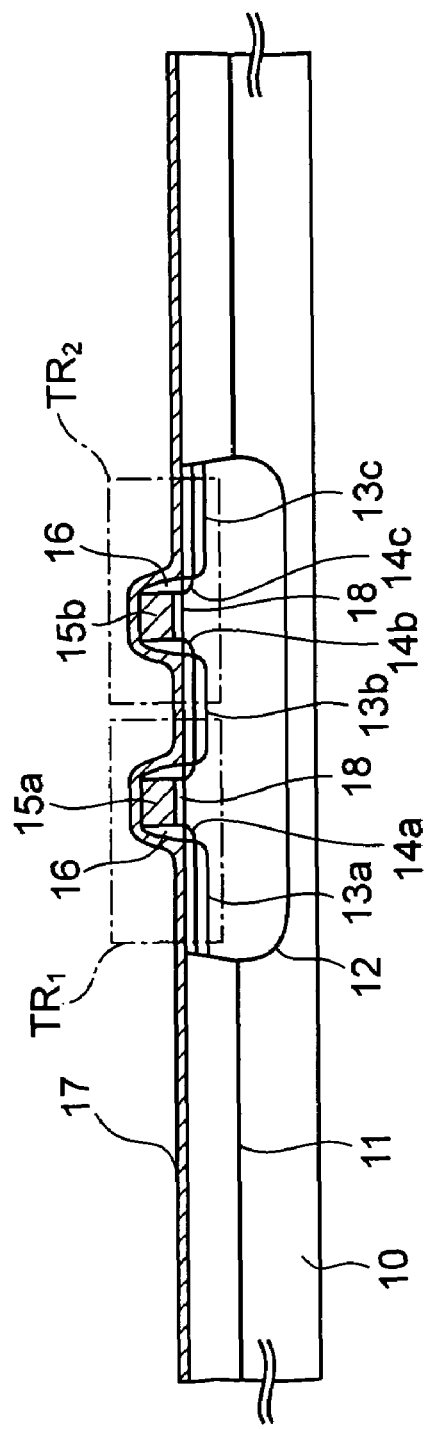
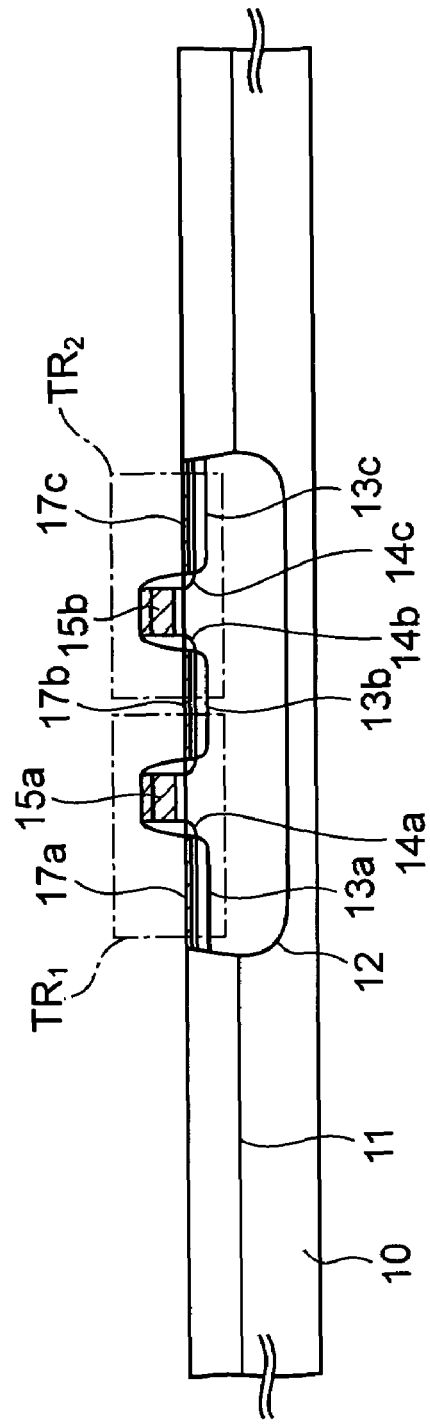
FIG. 1A
FIG. 1B

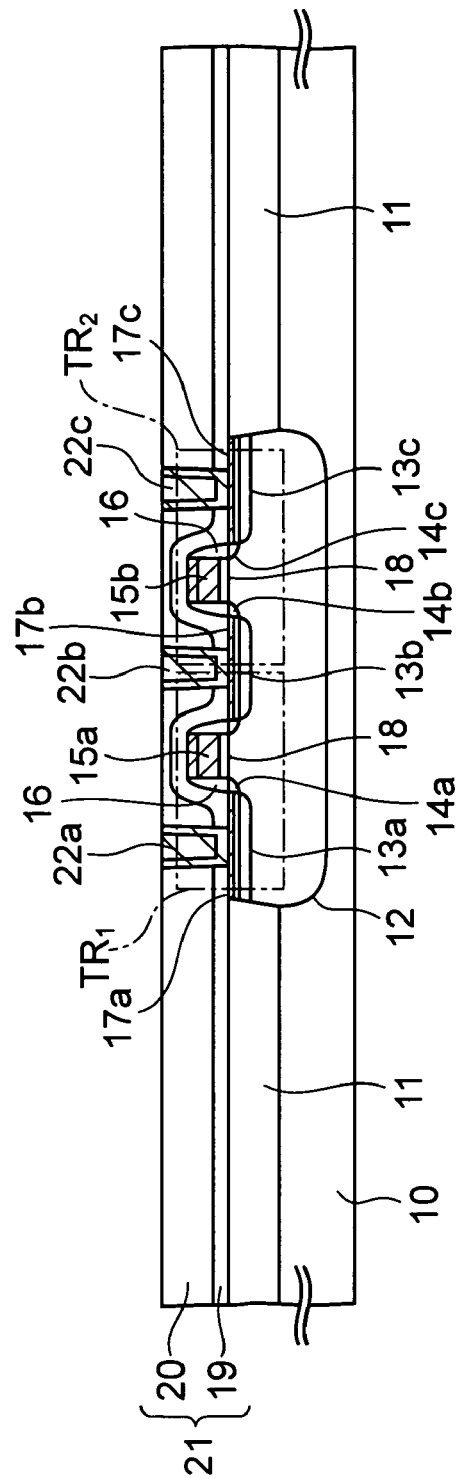
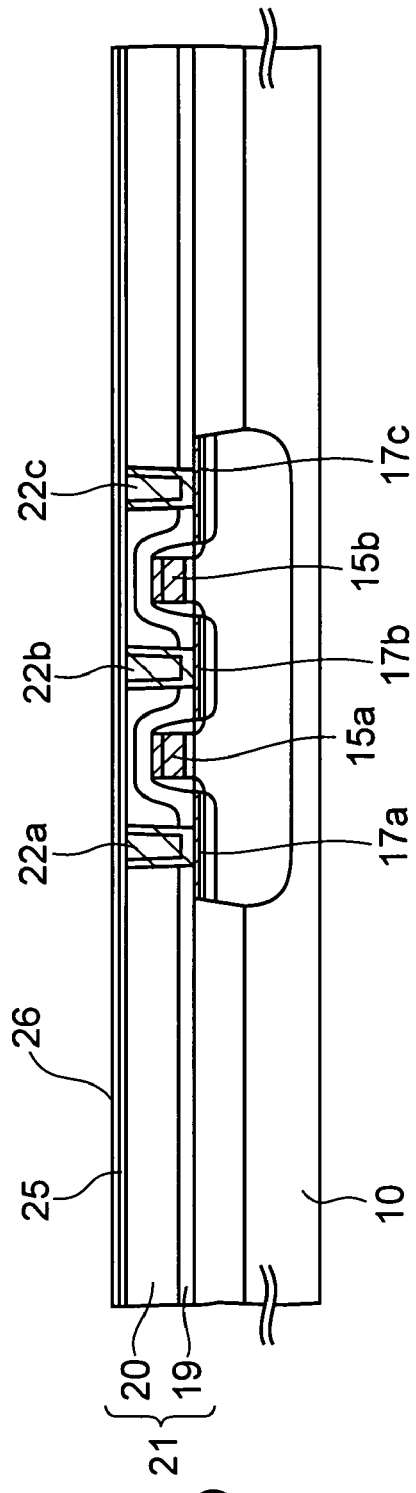

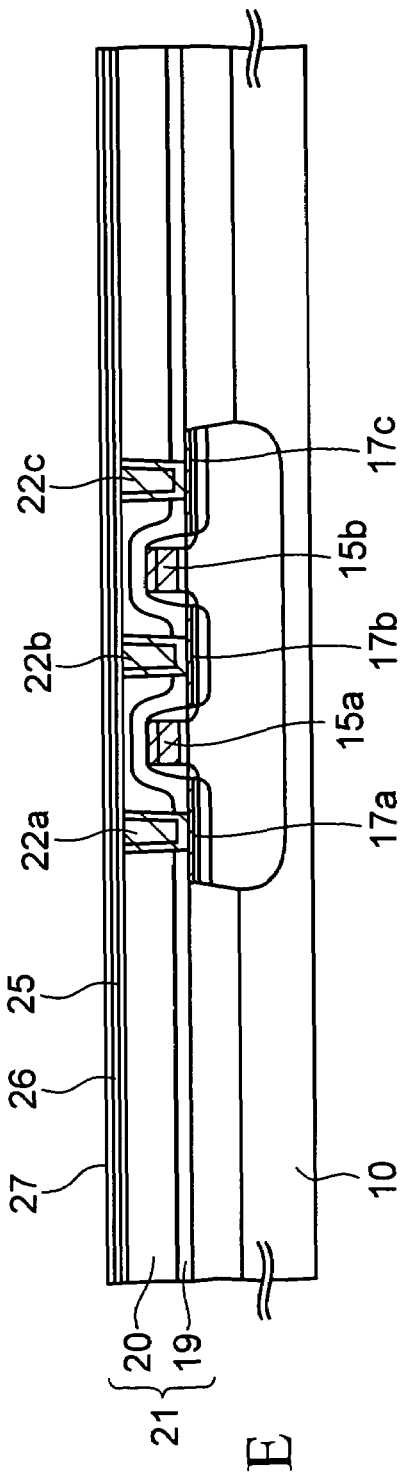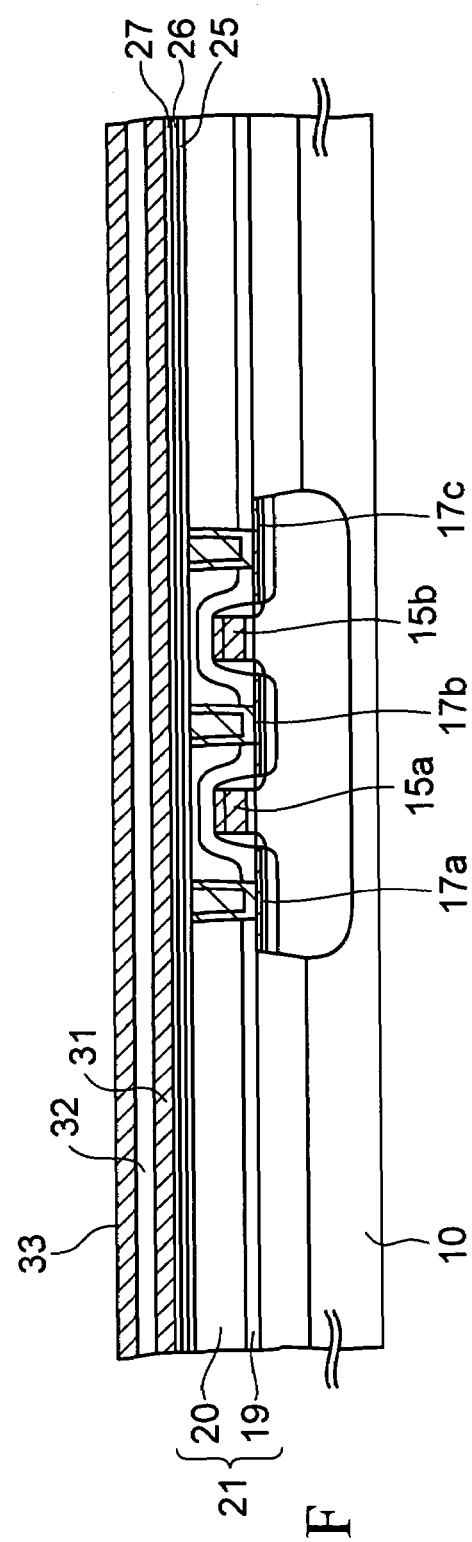

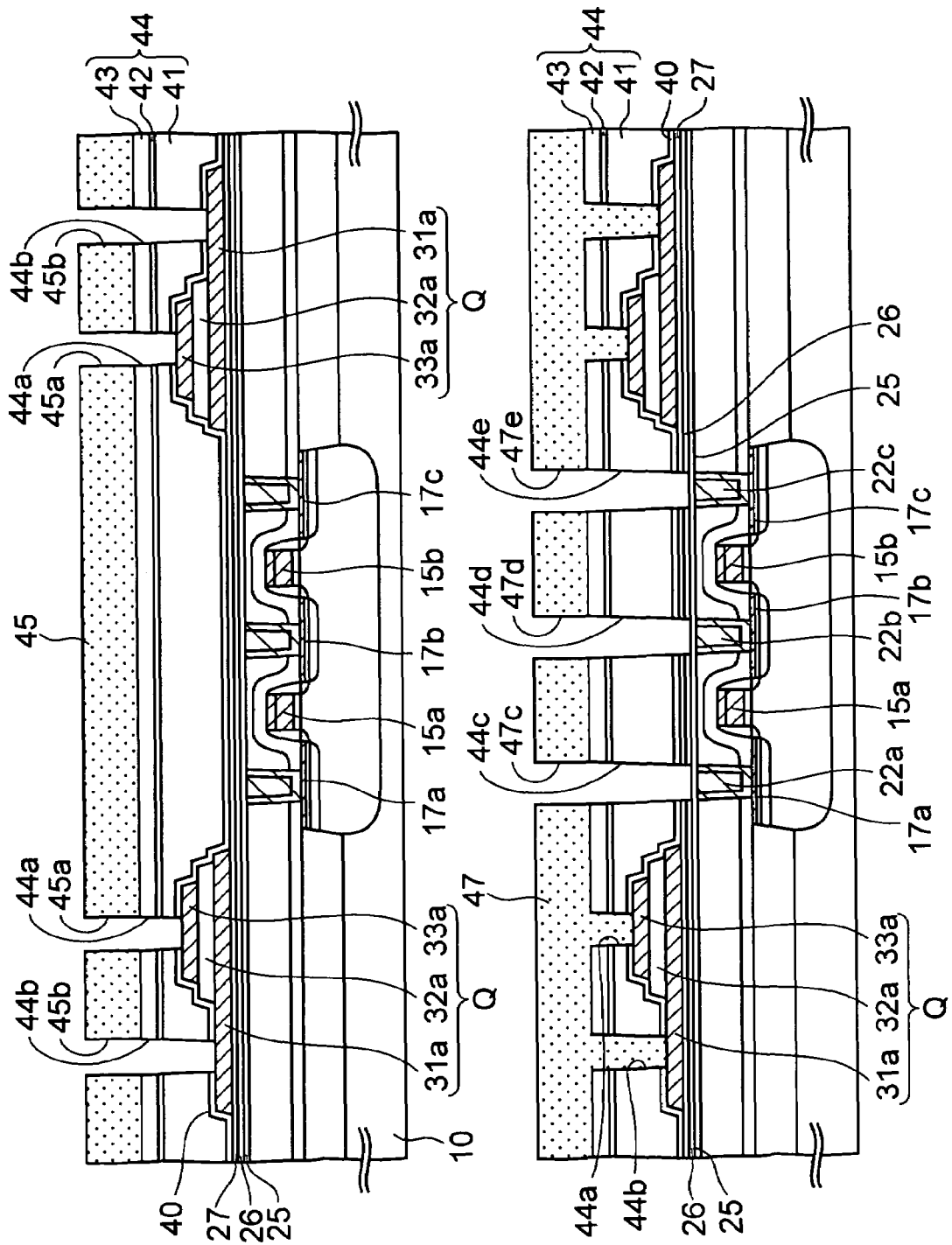

SEMICONDUCTOR DEVICE MANUFACTURING METHOD

CROSS-REFERENCE TO RELATED APPLICATIONS

This application is based on and claims priority of Japanese Patent Application No. 2005-168603 filed on Jun. 8, 2005, the entire contents of which are incorporated herein by reference.

BACKGROUND OF THE INVENTION

1. Field of the Invention

The present invention relates to a semiconductor device manufacturing method.

2. Description of the Related Art

As the nonvolatile memory that can store information after a power supply is turned off, the flash memory and the ferroelectric memory are known.

Out of them, the flash memory has a floating gate that is buried in a gate insulating film of an insulated-gate field effect transistor (IGFET), and stores information by accumulating a charge representing the stored information in this floating gate. However, such flash memory possesses a defect that, since a tunnel current must be supplied to the gate insulating film in writing or erasing the information, a relatively high voltage is required.

In contrast, the ferroelectric memory, called also FeRAM (Ferroelectric Random Access Memory), stores information by utilizing the hysteresis characteristic of a ferroelectric film that a ferroelectric capacitor includes. In this ferroelectric film, the polarization occurs in response to a voltage applied between an upper electrode and a lower electrode of the capacitor, and the spontaneous polarization still remains after the voltage is removed. This spontaneous polarization is reversed when the polarity of the applied voltage is reversed. Thus, the information can be written into the ferroelectric film by relating respective directions of the spontaneous polarization to "1" and "0". The FeRAM has such advantages that a voltage required for the writing is lower than that in the flash memory and the information can be written at a higher rate than the flash memory.

In manufacturing such FeRAM, the annealings peculiar to the FeRAM, such as the crystallizing annealing for crystallizing the capacitor dielectric film, and the recovery annealing for recovering the capacitor dielectric film from the damage caused by etching or sputter, are performed. These annealings contribute to improve the ferroelectric characteristics of the capacitor dielectric film. However, portions other than the capacitor, e.g., a refractory metal silicide layer on the source/drain region of a MOS transistor, suffers from an unnecessary heat load by these annealings, and hence there arises concern that the characteristics of the MOS transistor are deteriorated.

Need exists, therefore, to improve the characteristics of the capacitor dielectric film by optimizing the annealing conditions such as annealing time and annealing temperature, as well as suppressing the deterioration of the characteristics of the MOS transistor, in the steps of manufacturing the FeRAM.

Here, the technologies related to the present invention are set forth in following Patent Literatures 1 to 3.

In Patent Literature 1 among them, an upper surface of the cobalt silicide (CoSi) layer is covered with a metal film or the like, and then the RTA (Rapid Thermal Annealing) is applied in this condition. Thus, agglomeration of the cobalt silicide is prevented.

Also, in Patent Literature 2, a titanium layer is formed on the cobalt silicide layer, and then the cobalt silicide layer is annealed. Thus, titanium in the titanium layer is diffused into the cobalt silicide layer, so that the crystal structure of the cobalt silicide layer is stabilized.

Then, in Patent Literature 3, the annealing is applied to the capacitor dielectric film in the oxygen or ozone plasma atmosphere, thereby lowering the annealing temperature.

[Patent Literature 1] Patent Application Publication (KOKAI) 2003-347311

[Patent Literature 2] Patent Application Publication (KOKAI) 2003-303786

[Patent Literature 3] Japanese Patent Publication (KOKAI) Hei 6-21333

SUMMARY OF THE INVENTION

According to an aspect of the present invention, there is provided a semiconductor device manufacturing method, which includes a step of forming a refractory metal silicide layer in a partial area of a semiconductor substrate; a step of forming an insulating film on the refractory metal silicide layer; a step of forming a first conductive film, a ferroelectric film, and a second conductive film in sequence on the insulating film; a step of forming a capacitor consisting of a lower electrode, a capacitor dielectric film, and an upper electrode by patterning the first conductive film, the ferroelectric film, and the second conductive film; and a step of performing an annealing with such a annealing time that an agglomeration area of the refractory metal silicide layer becomes equal to or less than an upper limit area.

According to the present invention, since the annealing is performed for an annealing time such that an agglomeration area of the refractory metal silicide layer becomes equal to or less than an upper limit area, it can be prevented that the resistance of the refractory metal silicide layer is increased due to an increase of the agglomeration area at the annealing. Therefore, even in the case where the refractory metal silicide layer is formed on the source/drain region of the MOS transistor and then the annealing is carried out to the resultant structure, the resistance of the source/drain region can be reduced sufficiently by the refractory metal silicide layer.

Such annealing includes the recovery annealing for the capacitor dielectric film using the furnace, and the crystallizing annealing conducted by applying the rapid thermal annealing to the ferroelectric film, for example. These annealings are peculiar to the FeRAM, and the large heat load is applied to the refractory metal silicide layer. Therefore, when the annealing time is decided by defining an upper limit area of the agglomeration area as described above, it can be prevented that the resistance of the refractory metal silicide layer is increased.

DESCRIPTION OF THE PREFERRED EMBODIMENT

An embodiment of the present invention will be explained in detail with reference to the accompanying drawings hereinafter.

Figure 1G:
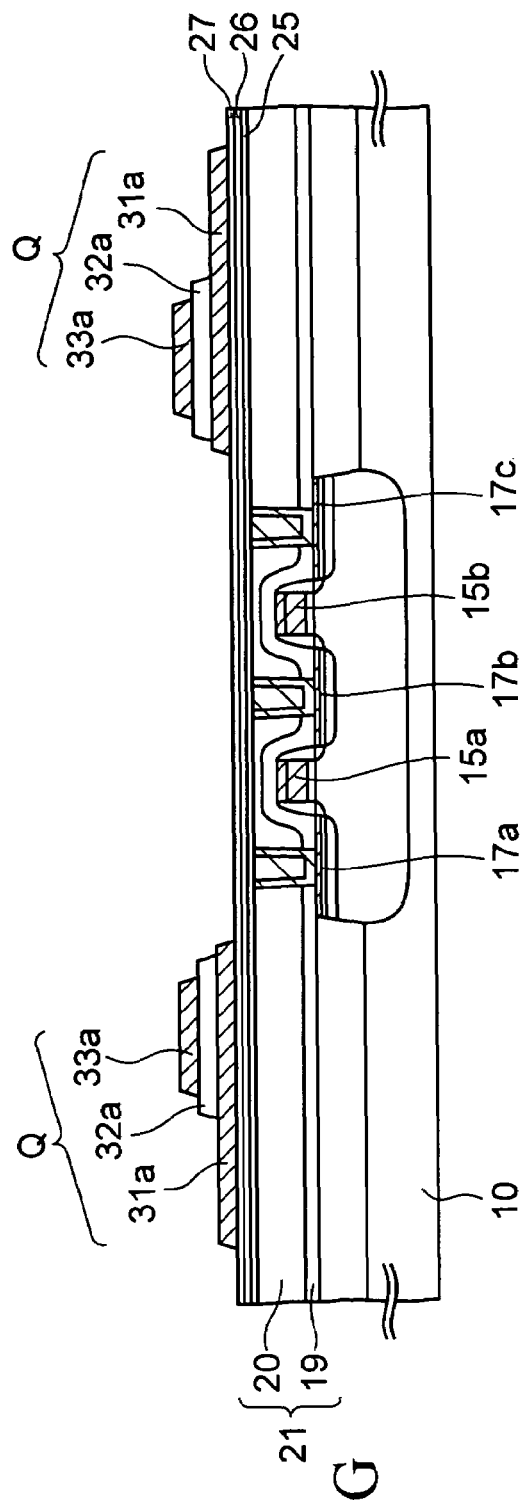
FIGS. 1A to 1N are sectional views of a semiconductor device according to an embodiment of the present invention in the middle of manufacture.
Figure 1H:
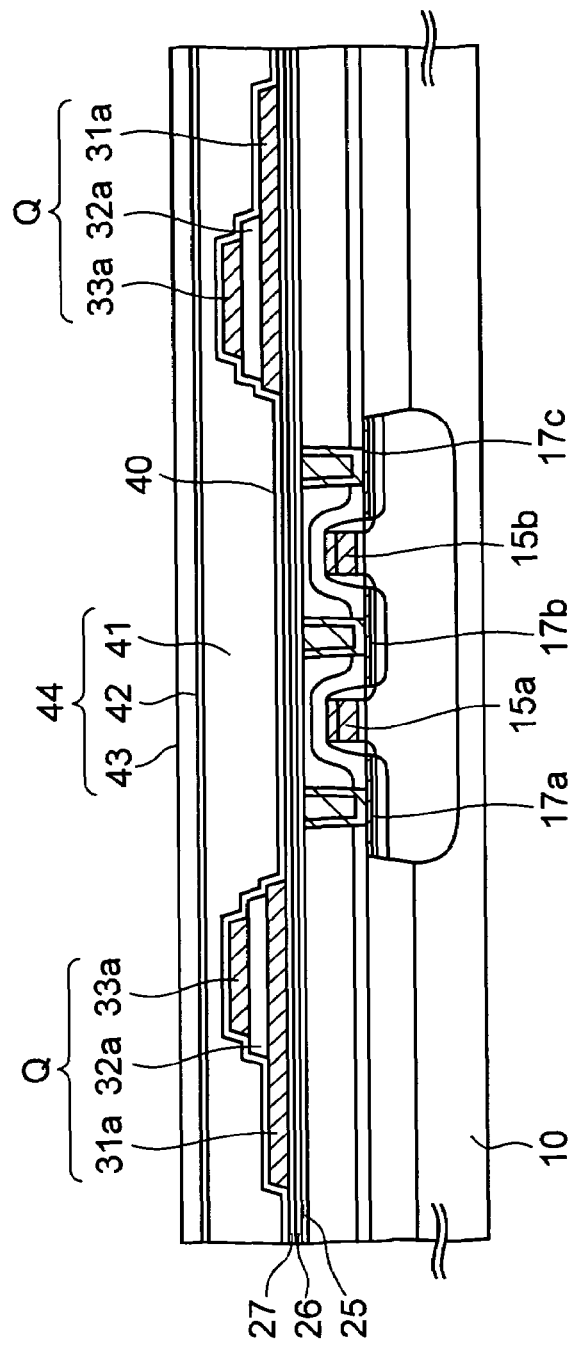
Figure 1K:
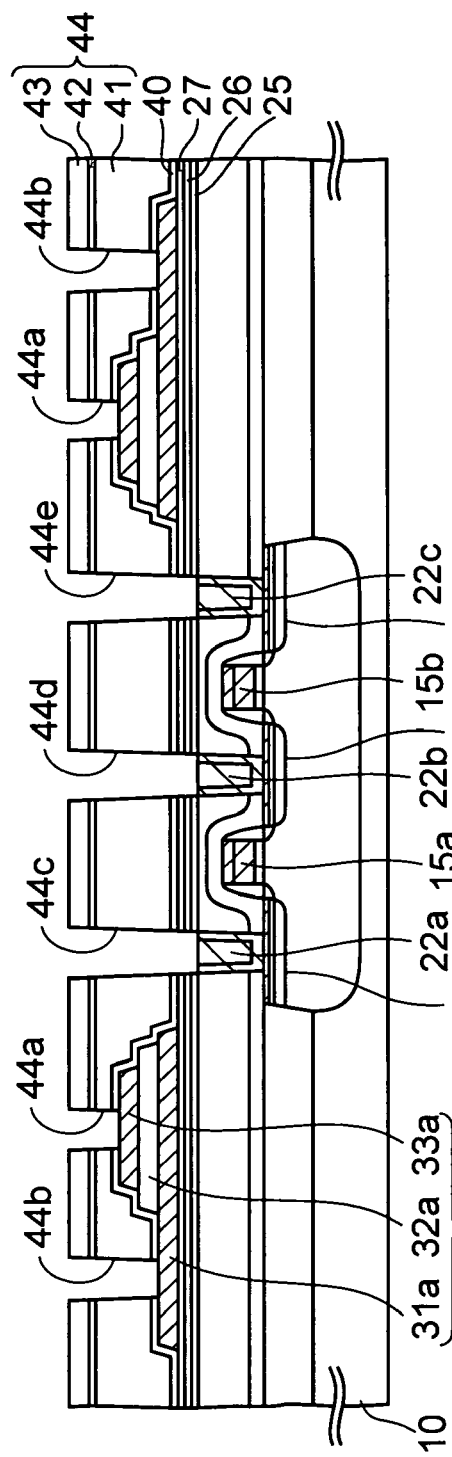
Figure 1L:
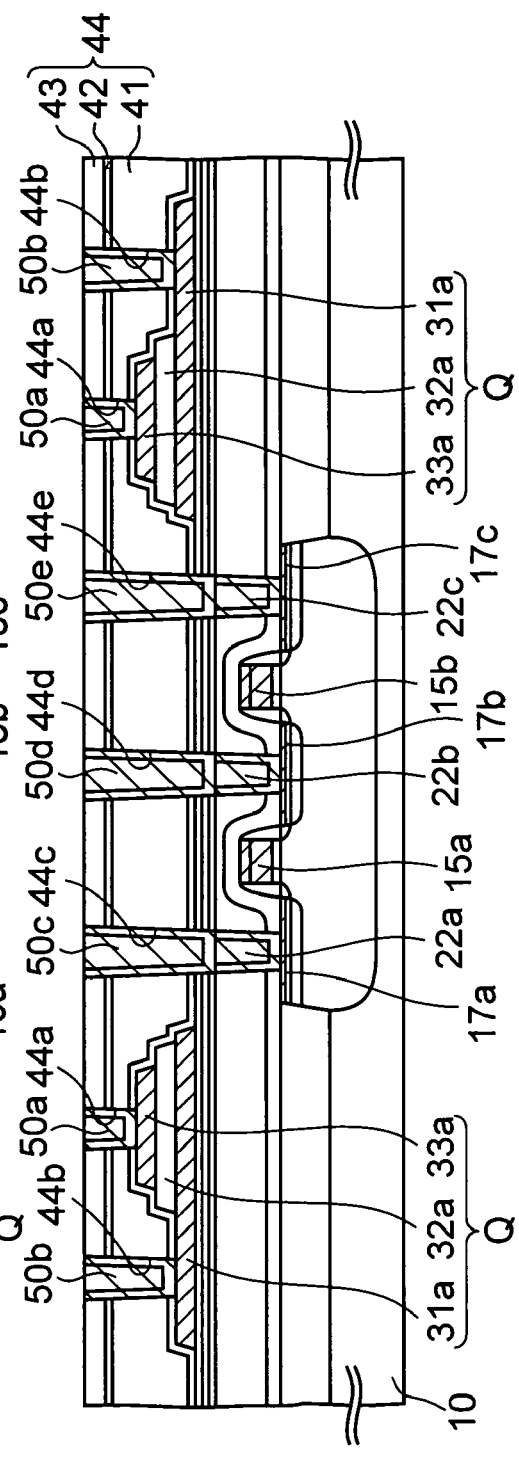
Figure 1M:
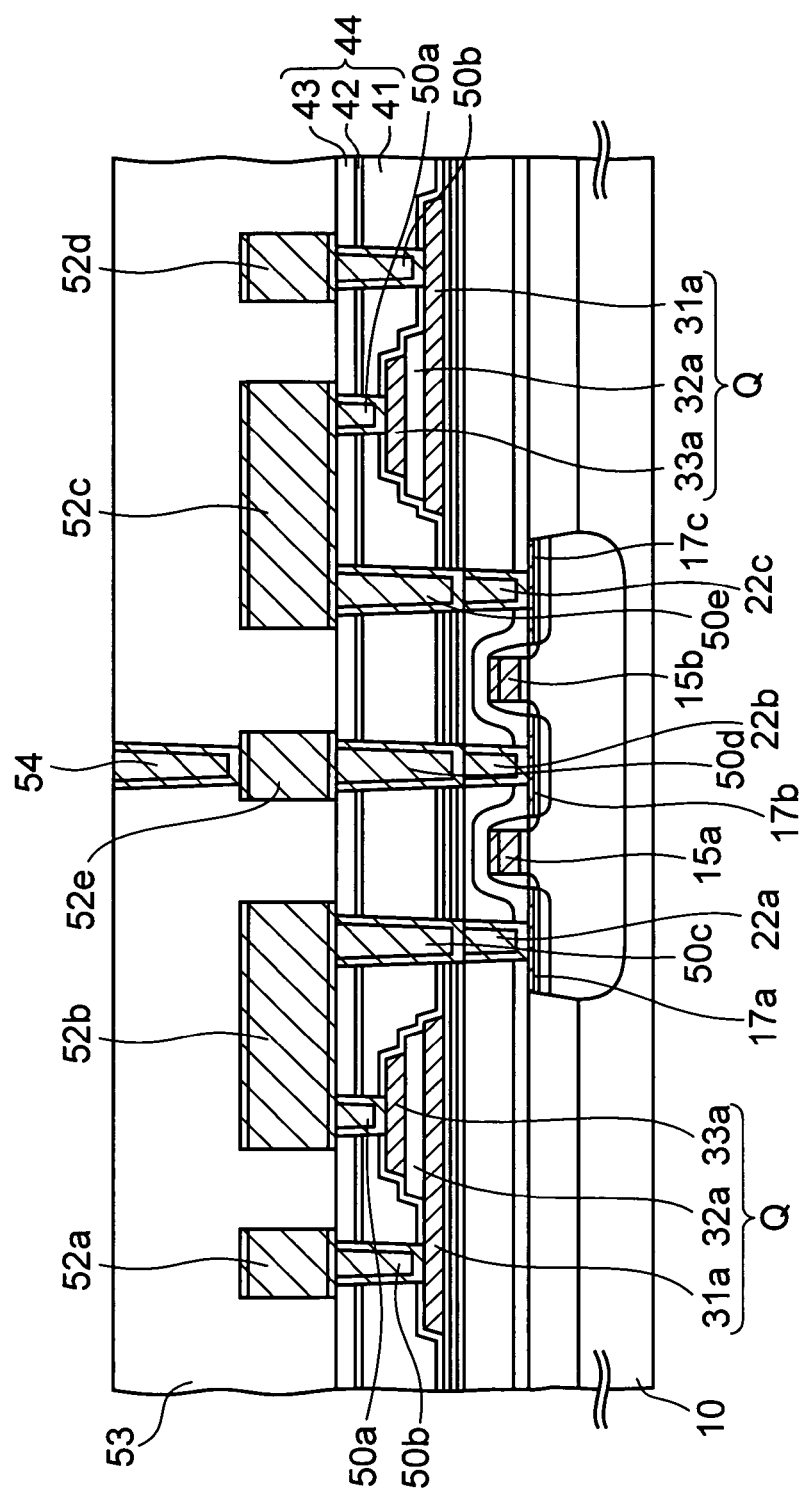
Figure 1N:
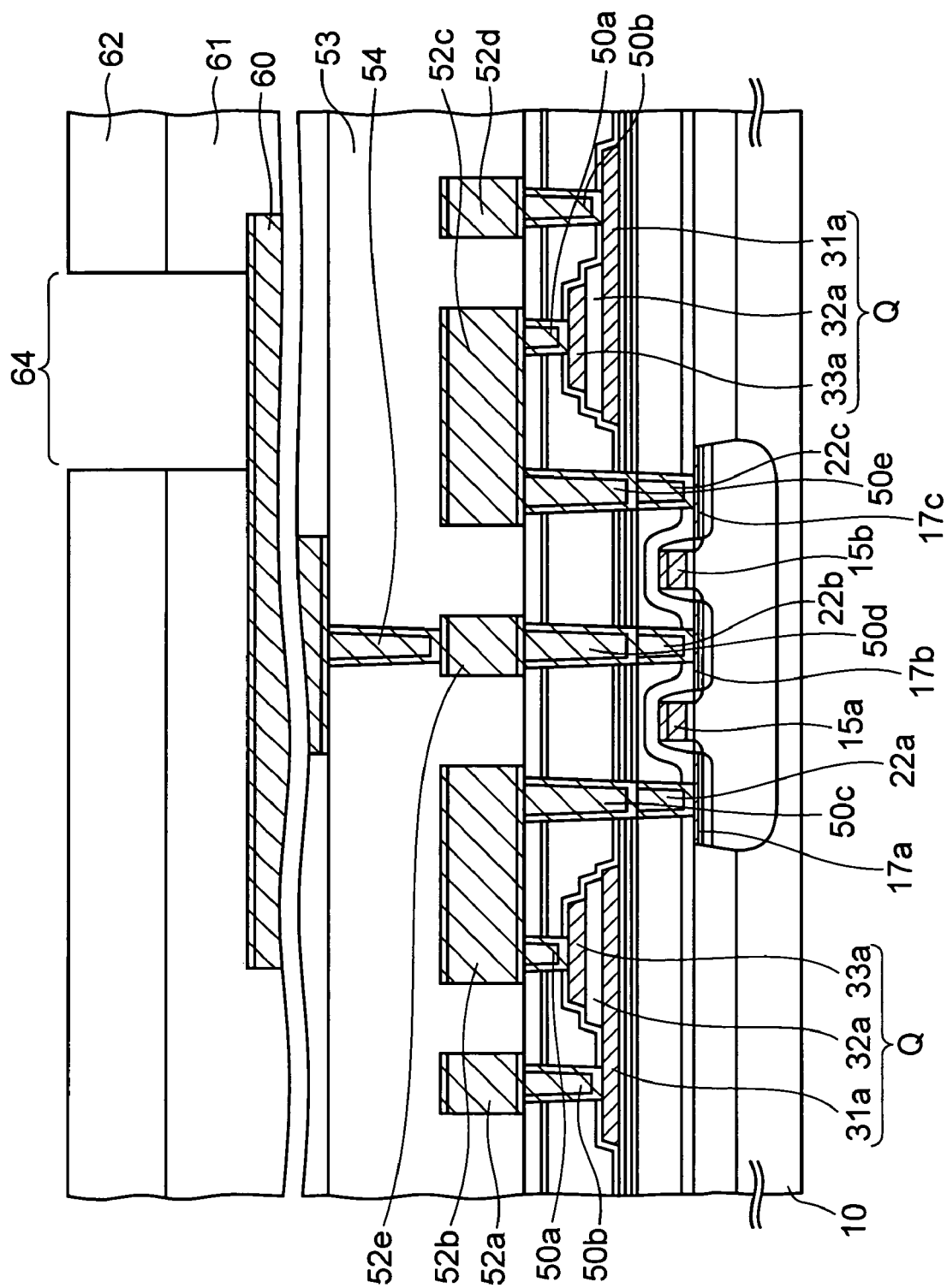

FIGS. 1A to 1N are sectional views of a semiconductor device according to an embodiment of the present invention in the middle of manufacture.

First, the steps required until a sectional structure shown in FIG. 1A is obtained will be explained hereunder.

An STI (Shallow trench Isolation) trench to define an active region of the transistor is formed on a surface of an n-type or p-type silicon (semiconductor) substrate 10. Then, an element isolation insulating film 11 is formed by filling an insulating film such as a silicon oxide film or the like in the trench. Here, an element isolation structure is not limited to STI, and the element isolation insulating film 11 may be formed by the LOCOS (Local Oxidation of Silicon) method.

Next, a p-well 12 is formed by introducing the p-type impurity into the active region of the silicon substrate 10. Then, a thermal oxide film serving as a gate insulating film 18 is formed by thermally oxidizing a surface of the active region.

Subsequently, an amorphous silicon film or a polysilicon film is formed on an entire upper surface of the silicon substrate 10. Then, gate electrodes 15a, 15b are formed by patterning this silicon film by means of the photolithography and the etching.

Two gate electrodes 15a, 15b are formed on the p-well 12 in parallel at an interval. These gate electrodes 15a, 15b constitute a part of the word line.

Next, the n-type impurity is introduced into the silicon substrate 10 on both sides of the gate electrodes 15a, 15b by the ion-implantation, while using the gate electrodes 15a, 15b as a mask. Thus, first to third source/drain extensions 14a to 14c are formed.

Thereafter, an insulating film is formed on the entire upper surface of the silicon substrate 10. And an insulating sidewall 16 is left on side surfaces of the gate electrodes 15a, 15b respectively by etching back the insulating film. As such insulating film, a silicon oxide film is formed by the CVD method, for example.

Subsequently, while using the insulating sidewalls 16 and the gate electrodes 15a, 15b as a mask, the n-type impurity is ion-implanted into the silicon substrate 10 again. Thus, first to third source/drain regions 13a to 13c are formed on the silicon substrate 10 on both sides of the gate electrodes 15a, 15b.

With the steps applied up to now, first and second MOS transistors $TR_1$, $TR_2$ consisting of the gate insulating film 18, the gate electrodes 15a, 15b, and the first to third source/drain regions 13a to 13c are formed in the active region (partial region) of the silicon substrate 10.

Next, a degassing process is performed in the reduced pressure atmosphere at a substrate temperature of 350° C. and a process time of 60 seconds, and then a refractory metal layer 17 formed of a cobalt layer is formed on the silicon substrate 10 and the gate electrodes 15a, 15b by the sputter method. In this case, since the cobalt layer is easily oxidized, a titanium nitride (TiN) film may be formed on the refractory metal layer 17 as the oxidation preventing film. This titanium nitride film is formed by the sputter method to have a thickness of about 30 nm.

Next, the steps required until a sectional structure shown in FIG. 1B is obtained will be explained hereunder.

First, the refractory metal layer 17 is heated in the nitrogen atmosphere to react with the silicon, thus forming first to third refractory metal silicide layers 17a to 17c made of cobalt silicide (CoSi) on the first to third source/drain regions 13a to 13c respectively. As the annealing conditions at this time, for example, the substrate temperature of 520° C. and the annealing time of 30 seconds are employed. Also, the refractory metal silicide layer is formed on surface layer portions of the gate electrodes 15a, 15b, so that the resistance of the gate electrodes 15a, 15b is lowered.

Then, the unreacted refractory metal layer 17, remained on the element isolation insulating film 11 for example, is removed by the wet etching. The conditions of the wet etching are not particularly limited. In the present invention, APM (Ammonia Peroxide Mixture) made of a mixed solution consisting of $NH_4OH$, $H_2O_2$, and $H_2O$ is employed as an etchant, and the etching time is set to about 5 minutes.

Here, in the case where the titanium nitride film is formed as the oxidation preventing film for the refractory metal layer 17, it is preferable that the wet etching be further applied by using SPM (Sulfuric Peroxide Mixture) after the wet etching in order to remove a titanium component. This SPM is a mixed solution consisting of $H_2SO_4$ and $H_2O_2$, and the etching time of this wet etching is set to 12 minutes, for example.

Thereafter, the annealing is carried out in the nitrogen atmosphere at the substrate temperature of 840° C. for 30 minutes, thereby converting the cobalt silicide constituting the first to third refractory metal silicide layers 17a to 17c into its low resistance phase ($CoSi_2$).

Although the cobalt silicide layer is formed as the first to third refractory metal silicide layers 17a to 17c in the above, a nickel silicide layer may be formed in place of the cobalt silicide layer.

Next, the steps required until a sectional structure shown in FIG. 1C is obtained will be explained hereunder.

First, a silicon nitride (SiN) film 19 of about 20 nm thickness is formed by the plasma CVD method. Then, a silicon oxide film 20 of about 80 nm thickness is formed on the silicon nitride film 19 by the plasma CVD method using a silane gas. Thereafter, a sacrifice silicon oxide film of about 1000 nm thickness is formed thereon by the plasma CVD method using a TEOS gas. Then, an upper surface of the sacrifice silicon oxide film is polished and planarized by the CMP (Chemical Mechanical Polishing) method. Thus, the silicon oxide film 20 and the silicon nitride film 19 left over the silicon substrate 10 constitute a first interlayer insulating film 21. As the result of the CMP, a thickness of the first interlayer insulating film 21 becomes about 700 nm on the planarized surface of the silicon substrate 10.

Next, first to third contact holes are formed on the first to third source/drain regions 13a to 13c respectively by patterning the first interlayer insulating film 21 by means of the photolithography and the etching. Then, a titanium film of about 30 nm thickness and a titanium nitride film of about 20 nm thickness are formed as a glue film in this order on inner surfaces of the first to third contact holes and an upper surface of the first interlayer insulating film 21 by the sputter and/or CVD method. Thereafter, a tungsten film is formed on the glue film by the CVD method using a tungsten hexafluoride gas such that the contact holes are filled completely by the tungsten film. Then, the extra tungsten film and the extra glue film on the first interlayer insulating film 21 is polished and removed by the CMP method. Thus, first to third contact plugs 22a to 22c made of these films are left in the contact holes. These first to third contact plugs 22a to 22c are electrically connected to the underlying first to third source/drain regions 13a to 13c respectively.

Meanwhile, the first to third contact plugs 22a to 22c are made mainly of tungsten. However, the tungsten is very easily oxidized, and contact failure is brought about when the tungsten is oxidized during the process.

Therefore, as shown in FIG. 1D, in the next step, as an oxidation preventing film 25 for protecting the first to third contact plugs 22a to 22c from the oxidizing atmosphere, a silicon oxide nitride (SiON) film is formed by the plasma CVD method to have a thickness of about 100 nm. Furthermore, a silicon oxide film of about 130 nm thickness is formed on the oxidation preventing film 25 by the plasma CVD method using the TEOS gas. The silicon oxide film thus formed is used as an insulating adhesive film 26.

Then, as shown in FIG. 1E, in order to enhance the crystallinity of the lower electrode of the ferroelectric capacitor described later, and improve finally the crystallinity of the capacitor dielectric film, a first alumina film 27 of about 20 nm thickness is formed on the insulating adhesive film 26 by the sputter method.

Next, the steps required until a sectional structure shown in FIG. 1F is obtained will be explained hereunder.

First, a noble metal film, e.g., a platinum film, of about 150 nm thickness is formed on the first alumina film 27 by the sputter method, and this noble metal film is used as a first conductive film 31.

Then, a PZT film of about 150 nm thickness is formed on the first conductive film 31 as a ferroelectric film 32 by the sputter method. As the film forming method for the ferroelectric film 32, there are the MOCVD (Metal Organic CVD) method and the sol-gel method in addition to the sputter method. Also, the material of the ferroelectric film 32 is not limited to the PZT. The ferroelectric film 32 may be formed of the Bi layer structure compound such as $SrBi_2Ta_2O_9$ and $SrBi_2(Ta,Nb)_2O_9$, or PLZT formed by adding lanthanum to PZT, or other metal oxide ferroelectric material.

Then, the RTA is applied to the PZT constituting the ferroelectric film 32 in the atmosphere, which contains 1% oxygen and 99% argon, to crystallize the PZT. As the conditions of the RTA, the substrate temperature is set to 725° C., the process time is set to 120 seconds, and a programming rate is set to 125° C./sec for example. Such annealing is also called the crystallizing annealing. In this specification, the substrate temperature in the annealing is defined as the maximum temperature of the silicon substrate 10 in the annealing. This is also the case for the furnace annealing described later, as well as the RTA.

Then, an iridium oxide ($IrO_2$) film of about 250 nm thickness is formed on the ferroelectric film 32 by the sputter method, and this film is used as a second conductive film 33. It should be noted that the second conductive film 33 may be formed of a noble metal film or a noble metal oxide film. In place of the iridium oxide film, a noble metal film such as an iridium film, a platinum film, or the like may be formed as the second conductive film 33.

Then, as shown in FIG. 1G, the second conductive film 33, the ferroelectric film 32, and the first conductive film 31 are separately patterned in this order by the photolithography and the etching, thus forming an upper electrode 33a, a capacitor dielectric film 32a, and a lower electrode 31a, each constitute a ferroelectric capacitor Q.

Next, the steps required until a sectional structure shown in FIG. 1H is obtained will be explained hereunder.

First, a second alumina film 40 is formed on the entire upper surface of the silicon substrate 10. This second alumina film 40 protects the capacitor Q from the reducing atmosphere such as hydrogen, or the like, and thus prevents the deterioration of the capacitor dielectric film 32a. The second alumina film 40 is formed by the sputter method, for example, to have a thickness of about 20 nm.

Then, in order to recover the capacitor dielectric film 32a from the damage caused by the etching, the sputtering, and the like in the steps applied up to now, the annealing is carried out in the 100% oxygen atmosphere in the furnace at the substrate temperature 650° C. Here, how to decide this annealing time will be described later. Such annealing is also called the recovery annealing.

Then, a silicon oxide film 41 of about 1500 nm thickness is formed on the second alumina film 40 by the plasma CVD method using the TEOS gas as a reaction gas. Convexity and concavity is formed on an upper surface of the silicon oxide film 41 to reflect the shape of the capacitor Q. In order to get rid of such convexity and concavity, the upper surface of the silicon oxide film 41 is polished and planarized by the CMP method, and a thickness of the silicon oxide film 41 on the flat surface of the second alumina film 40 is made into about 1000 nm.

Thereafter, as the dehydrating process of the silicon oxide film 41, the surface of the silicon oxide film 41 is exposed to the $N_2O$ plasma. Instead of such $N_2O$ plasma, the silicon oxide film 41 may be annealed in the furnace to dehydrate it.

Next, in order to protect the capacitor Q from the hydrogen or the water content generated in later steps, a third alumina film 42 of about 50 nm thickness is formed on the silicon oxide film 41 by the sputter method. Then, a silicon oxide film 43 of about 200 nm thickness is formed on the third alumina film 42 by the plasma CVD method.

With the steps performed up to now, a second interlayer insulating film 44 consisting of the silicon oxide films 41, 43 and the third alumina film 42 is formed on the capacitor Q.

Subsequently, as shown in FIG. 1I, the photoresist is coated on the second interlayer insulating film 44, and then exposed and developed. Thus, a first resist pattern 45 having first and second windows 45a, 45b like a hole profile is formed.

Next, the silicon substrate 10 is put into the parallel plate type plasma etching chamber, and then the second interlayer insulating film 44 and the underlying second alumina film 40 are etched via the first and second windows 45a, 45b while using a gas mixture consisting of $C_4F_8$, Ar, $O_2$, and CO as an etching gas. Thus, first and second holes 44a, 44b are formed in the second interlayer insulating film 44 on the upper electrode 33a and the lower electrode 31a respectively.

After that, the first resist pattern 45 is removed. Then, for the purpose of recovering the damage of the capacitor Q, the annealing may be carried out in the oxygen atmosphere at the substrate temperature of 500° C., for example.

Next, as shown in FIG. 1J, the photoresist is coated again on the second interlayer insulating film 44, and then exposed and developed. Thus, a second resist pattern 47, in which hole-shaped third to fifth windows 47c to 47e are formed on the first to third contact plugs 22a to 22c respectively, is formed. In this case, the first and second holes 44a, 44b are covered with the second resist pattern 47.

Then, the second interlayer insulating film 44, the first and second alumina films 27, 40, and the insulating adhesive film 26 are etched via the third to fifth windows 47c to 47e. Thus, third to fifth holes 44c to 44e are formed on the contact plugs 22a to 22c respectively. Such etching is performed in the parallel plate type plasma etching machine using a gas mixture consisting of $C_4F_8$, Ar, $O_2$, and CO as an etching gas. The oxidation preventing film 25 serves as an etching stopper film, and the etching is stopped on the oxidation preventing film 25.

Thereafter, the second resist pattern 47 is removed.

As described above, the deep third to fifth holes 44c to 44e are formed on the first to third contact plugs 22a to 22c respectively by the separate steps from the shallow first and second holes 44a, 44b formed on the capacitor Q. Therefore, it can be prevented that the capacitor Q is exposed to the etching atmosphere for a long time and thus deteriorated.

Next, the steps required until a sectional structure shown in FIG. 1K is obtained will be explained hereunder.

First, the silicon substrate 10 is put into the parallel plate type plasma etching chamber, and then a gas mixture consisting of $CHF_3$, Ar, and $O_2$ is supplied to the etching equipment as an etching gas. According to this, the oxidation preventing film 25 under the third to fifth holes 44c to 44e is exposed to the etching atmosphere and removed, and thus the first to third contact plugs 22a to 22c are exposed from these holes. Also, extraneous substance in the first and second holes 44a, 44b is removed, and thus the upper surfaces of the upper electrode 33a and the lower electrode 31a are cleaned.

Moreover, the first to third contact plugs 22a to 22c are covered with the oxidation preventing film 25 until the present step is ended. Therefore, it can be prevented that the tungsten constituting the contact plugs 22a to 22c is oxidized to cause the contact failure.

Next, the steps required until a sectional structure shown in FIG. 1L is obtained will be explained hereunder.

First, in order to clean the inner surfaces of the first to fifth holes 44a to 44e, the inner surfaces of respective holes 44a to 44e are exposed to the argon atmosphere plasmanized by the high-frequency power and sputter-etched. An etching depth is set to about 10 nm in terms of film thickness of the silicon oxide film, for example. Then, a titanium nitride film of about 100 nm thickness is formed as a glue film on inner surfaces of the first to fifth holes 44a to 44e and an upper surface of the second interlayer insulating film 44 by the sputter method.

Then, a tungsten film is formed on the glue film by the CVD method such that the first to fifth holes 44a to 44e are buried completely by the tungsten film.

Thereafter, the extra glue film and the extra tungsten film on the upper surface of the second interlayer insulating film 44 are polished and removed by the CMP method, and these films are left in respective holes 44a to 44e. These films left in the first and second holes 44a, 44b are used as first and second conductive plugs 50a, 50b that are electrically connected to the upper electrode 33a and the lower electrode 31a respectively. Also, these films left in the third to fifth holes 44c to 44e are used as third to fifth conductive plugs 50c to 50e that are electrically connected to the first to third contact plugs 22a to 22c respectively.

Next, the steps required until a sectional structure shown in FIG. 1M is obtained will be explained hereunder.

First, a titanium film of about 60 nm thickness and a titanium nitride film of about 30 nm thickness are formed in this order on the second interlayer insulating film 44 and the first to fifth conductive plugs 50a to 50e by the sputter method. These films constitute a barrier metal layer. Then, a copper-containing aluminum film, a titanium film, and a titanium nitride film are formed on the barrier metal layer in this order as a metal laminated film by the sputter method to have a thickness of about 360 nm, 5 nm, and 70 nm respectively.

Next, a silicon oxide nitride film (not shown) is formed as the reflection preventing film on the metal laminated film. Then, the metal laminated film and the barrier metal layer are patterned by the photolithography and the etching. Thus, first-layer metal wirings 52a to 52d and a conductive pad 52e are formed. It should be noted that copper film may be employed as the first-layer metal wirings 52a to 52d in place of the above metal laminated film containing aluminum film.

Subsequently, a silicon oxide film is formed as a third interlayer insulating film 53 by the plasma CVD method, and then this third interlayer insulating film 53 is planarized by the CMP method. Thereafter, a hole is formed on the conductive pad 52d by patterning the third interlayer insulating film 53 by means of the photolithography and the etching. Then, a sixth conductive plug 54 made mainly of the tungsten film is formed in the above hole.

Next, the steps required until a sectional structure shown in FIG. 1N is obtained will be explained hereunder.

First, second to fifth metal wirings and interlayer insulating films (not shown) are laminated one after the other on the third interlayer insulating film. Then, a silicon oxide film of about 720 nm thickness is formed on the uppermost fifth metal wiring 60 by the HDPCVD (High Density Plasma CVD) method, and this film is used as a first cover film 61. Further, a silicon nitride (SiN) film of about 500 nm thickness is formed on the first cover film 61 as a second cover film 62 by the plasma CVD method.

Then, a window 64 via which a bonding pad is extended outwardly is formed by patterning the first and second cover films 61, 62 by means of the photolithography and the etching. After that, the step of forming a passivation polyimide film is carried out, but its details will be omitted herein.

With the above, a basic structure of the FeRAM according to the present embodiment is completed.

In the above FeRAM manufacturing method, the annealing steps peculiar to the FeRAM such as the crystallizing annealing explained in FIG. 1F, and the recovery annealing explained in FIG. 1H are carried out. In order to investigate the influence of such annealings on the first to third source/drain regions 13a to 13c, the inventors of this application carried out following experiments.

Figure 2:
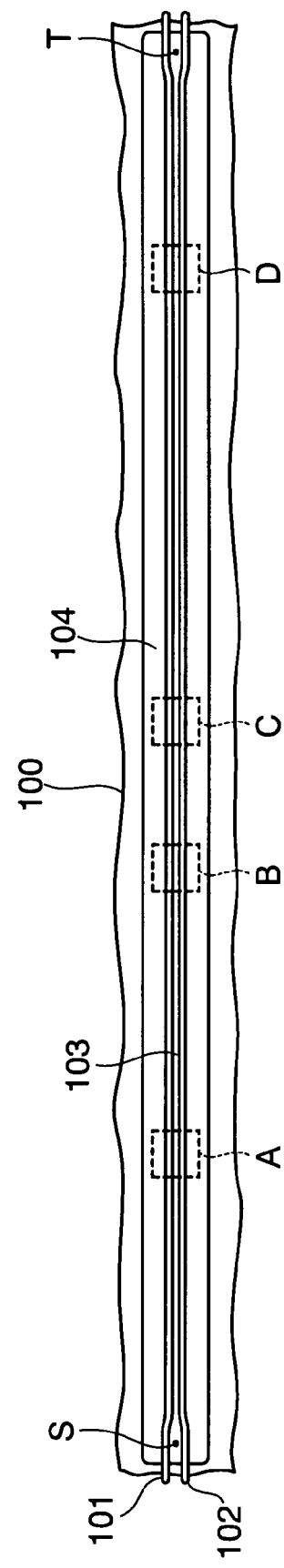
FIG. 2 is a plan view of a sample, which is manufactured in the embodiment of the present invention, depicted based on its SEM image.

FIG. 2 is a plan view of a sample, which is manufactured for this examination, drawn based on its SEM image. This sample was constructed by forming an element isolation insulating film 104 made of a silicon oxide on a silicon substrate 100 and then forming two parallel wirings 101, 102 made of polysilicon on the portion that is not covered with the element isolation insulating film 104, of the silicon substrate 100. Also, a cobalt silicide layer 103 was formed on the silicon substrate 100 between these wirings 101, 102 by the same film forming conditions as those applied to the first to third refractory metal silicide layers 17a to 17c explained in FIGS. 1A and 1B.

Here, an interval between the wirings 101, 102 was set to 0.24 μm and a length of them was set to 50 μm.

Furthermore, a total of 10 samples was prepared, and five of them were subjected to heat load by performing the above recover annealing and crystallizing annealing, whereas the remaining five samples were not subjected to the heat load. Thereafter, the resistance of the cobalt silicide layer 103 between an S point and a T point in FIG. 2 was measured in these samples. The histograms of the resistance when the heat load was applied are shown in FIG. 3A, and the histograms of the resistance when no heat load was applied are shown in FIG. 3B.

Figure 3A:
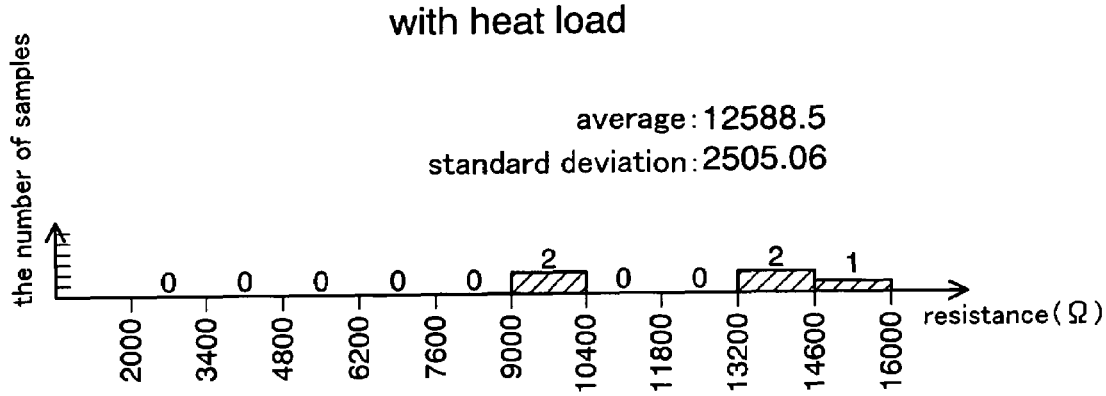
FIGS. 3A and 3B are a histogram of the resistance of the source/drain regions in the embodiment of the present invention when the heat load is applied and the heat load is not applied respectively.
Figure 3B:
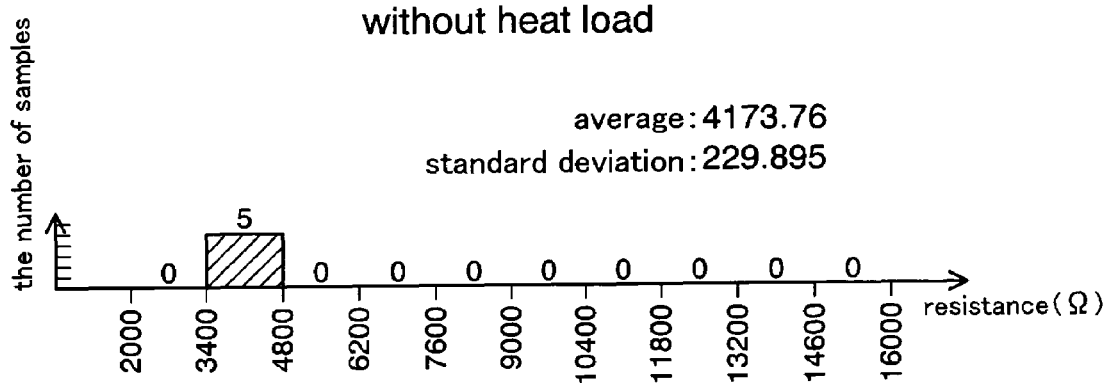

In FIGS. 3A and 3B, an abscissa denotes the resistance and an ordinate denotes the number of samples that has the concerned resistance.

As shown in FIG. 3B, all the resistances of five samples, to which the heat load of the FeRAM is not applied, were distributed within a low resistance range of about 3400 to 4800 Ω.

In contrast, as shown in FIG. 3A, a distribution of the resistances of five samples, to which the heat load is applied, was shifted to a higher resistance range than that of the samples to which no heat load is applied.

If the resistance of the cobalt silicide layer is increased, it is difficult to sufficiently lower the resistance of the underlying source/drain regions. Such disadvantage becomes more conspicuous as a width of the cobalt silicide layer becomes narrower with the progress of miniaturization.

Figure 4:
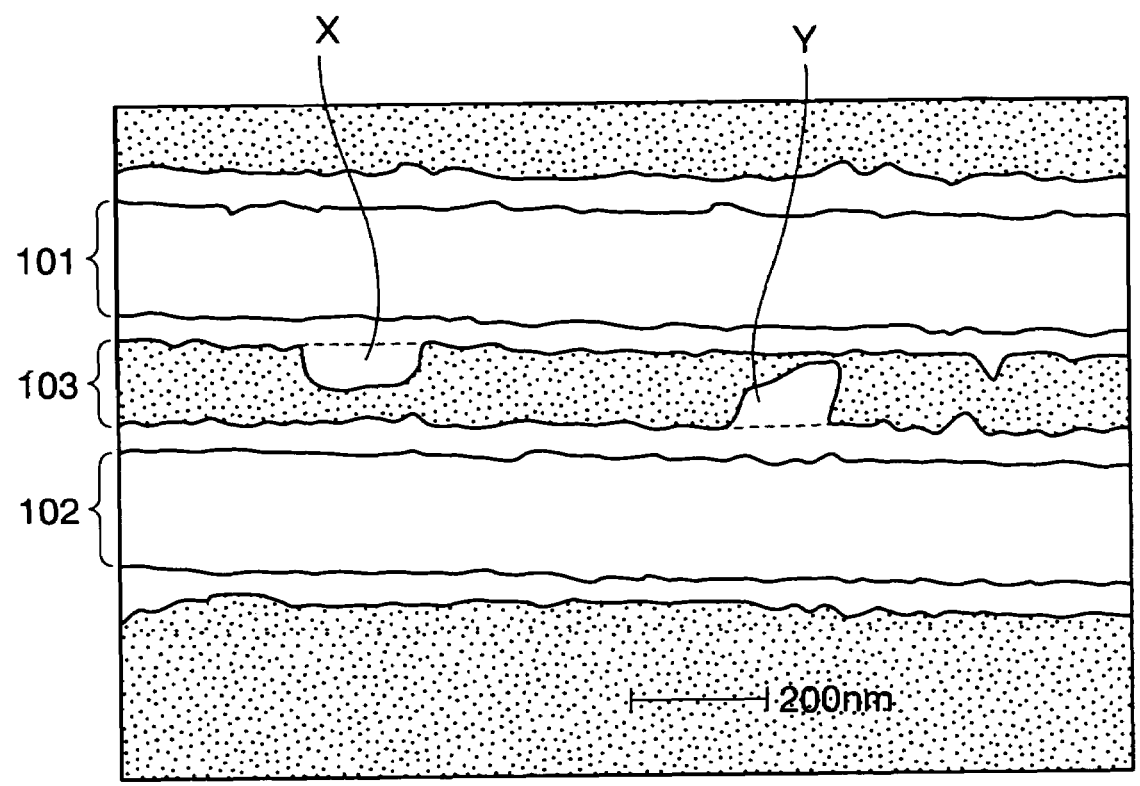
FIG. 4 is a view of the sample, to which the heat load is applied in the embodiment of the present invention, depicted based on its SEM image.

In order to investigate the cause leading to an increase in the resistance of the cobalt silicide layer 103 when the heat load is applied, the inventors of this application examined the samples to which the heat load is applied by the SEM (Scanning Electron Microscope). The result is shown in FIG. 4. FIG. 4 is a plan view of this sample, drawn based on its SEM image.

As shown in FIG. 4, in the sample to which the heat load is applied, the cobalt silicide layer 103 was agglomerated in portions X and Y and thus the cobalt silicide layer 103 was brought into an almost disconnected state in these portions.

Locations A to D shown in above FIG. 2 correspond to the places where such agglomeration appears. Since the agglomeration of the cobalt silicide layer was not found in the sample to which the heat load is not applied, it can be concluded that the increase in the resistance of the cobalt silicide layer 103 associated with the heat load is due to the above agglomeration.

Next, the inventors of this application investigated how the agglomeration area of the cobalt silicide layer 103 changes by the annealing temperature and time. Histograms thus obtained are shown in FIG. 5.

It should be noted that the agglomeration area is defined as an area of the portion from which the cobalt silicide layer 103 disappears due to agglomeration. In the example in FIG. 4, the area of the solid-white portion indicated by X or Y corresponds to the agglomeration area.

Figure 5:
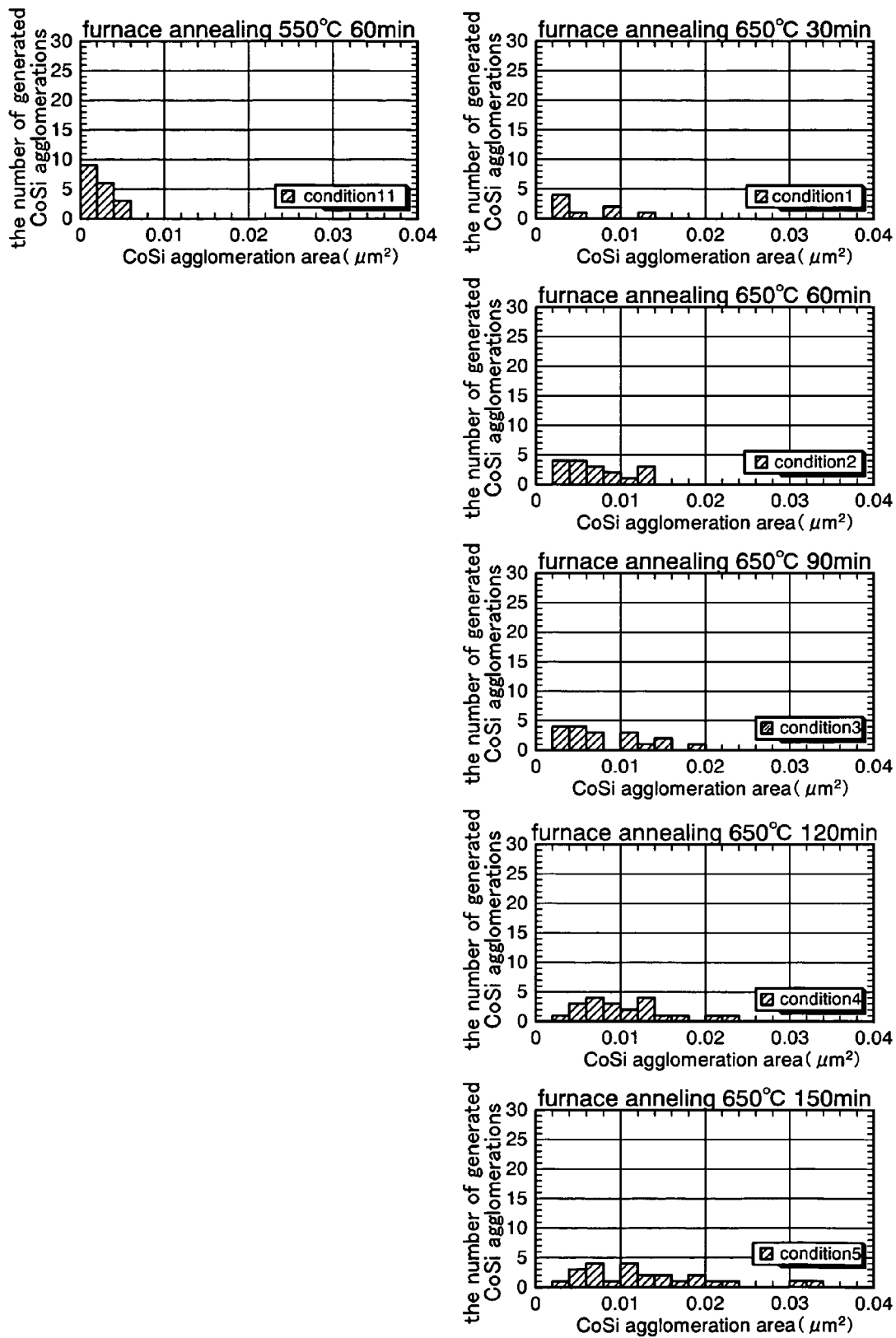
FIG. 5 shows histograms obtained by examining how a agglomeration area of a cobalt silicide layer is changed by a furnace annealing temperature and an annealing time in the embodiment of the present invention.

In the examination in FIG. 5, six samples similar to those explained in FIG. 2 were prepared. Then, while changing the annealing conditions, the furnace annealing corresponding to the recovery annealing of the FeRAM was applied to these samples respectively. An abscissa of respective histograms in FIG. 5 denotes the agglomeration area of the cobalt silicide layer 103 in respective samples, and an ordinate thereof denotes the number of the generated cobalt silicide agglomerations in one sample.

The substrate temperature and the annealing time applied in the furnace to obtain each graph are indicated on each histogram.

Also, a thickness of the cobalt silicide layer 103 was set to 8 nm in two histograms labeled "condition 1" and "condition 2" on the upper right portion of FIG. 5, while the thickness was set to 10 nm in remaining histograms labeled "conditions 3 to 5, 11" respectively.

As shown in five histograms on the right side in FIG. 5, in five samples to which the annealing was applied at the substrate temperature of 650° C., the distribution became broader as the annealing time gets longer, and thus the wide-area agglomeration was generated.

In addition, comparison between five histograms on the right side in FIG. 5 and one histogram on the left side shows that the agglomeration area became wider as the substrate temperature was set higher.

Figure 6:
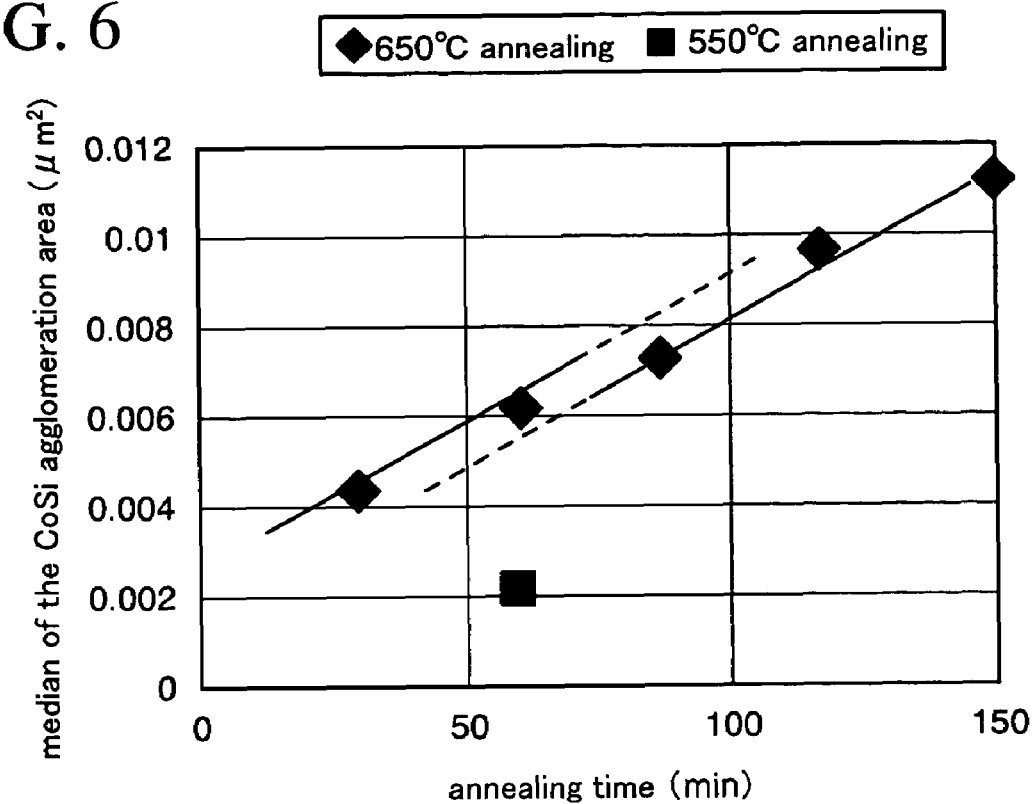
FIG. 6 is a graph obtained by examining a relationship between the agglomeration area of the cobalt silicide layer and the annealing time of the furnace annealing in the embodiment of the present invention.

Further, when a relationship between the agglomeration area and the annealing time was examined by using six histograms in FIG. 5, the result shown in FIG. 6 was obtained. An abscissa of FIG. 6 denotes the annealing time indicated on the top of each graph in FIG. 5, and an ordinate thereof denotes a median of the agglomeration area in each graph in FIG. 5.

As shown in a graph (first graph) in FIG. 6, it was found that the agglomeration area of the cobalt silicide layer depends linearly on the annealing time. Moreover, as apparent from FIG. 6, a size of the agglomeration area differs depending on a film thickness of the cobalt silicide layer, and a series of 10 nm thickness layers was shifted lower than a series of 8 nm thickness layers.

In the investigation in FIG. 5 and FIG. 6, the furnace annealing corresponding to the recovery annealing of the capacitor was carried out. On the contrary, in order to examine what tendency the agglomeration of the cobalt silicide layer exhibits when the crystallizing annealing is applied to the capacitor, the inventors of this application carried out further following investigation.

In this investigation, four samples similar to those explained in FIG. 2 were prepared, and then the RTA corresponding to the crystallizing annealing of the capacitor was applied to the samples respectively. Then, the agglomeration area of the cobalt silicide layer 103 and a frequency of occurrence were investigated in respective samples after the RTA. Histograms thus obtained are shown in FIG. 7.

Figure 7:
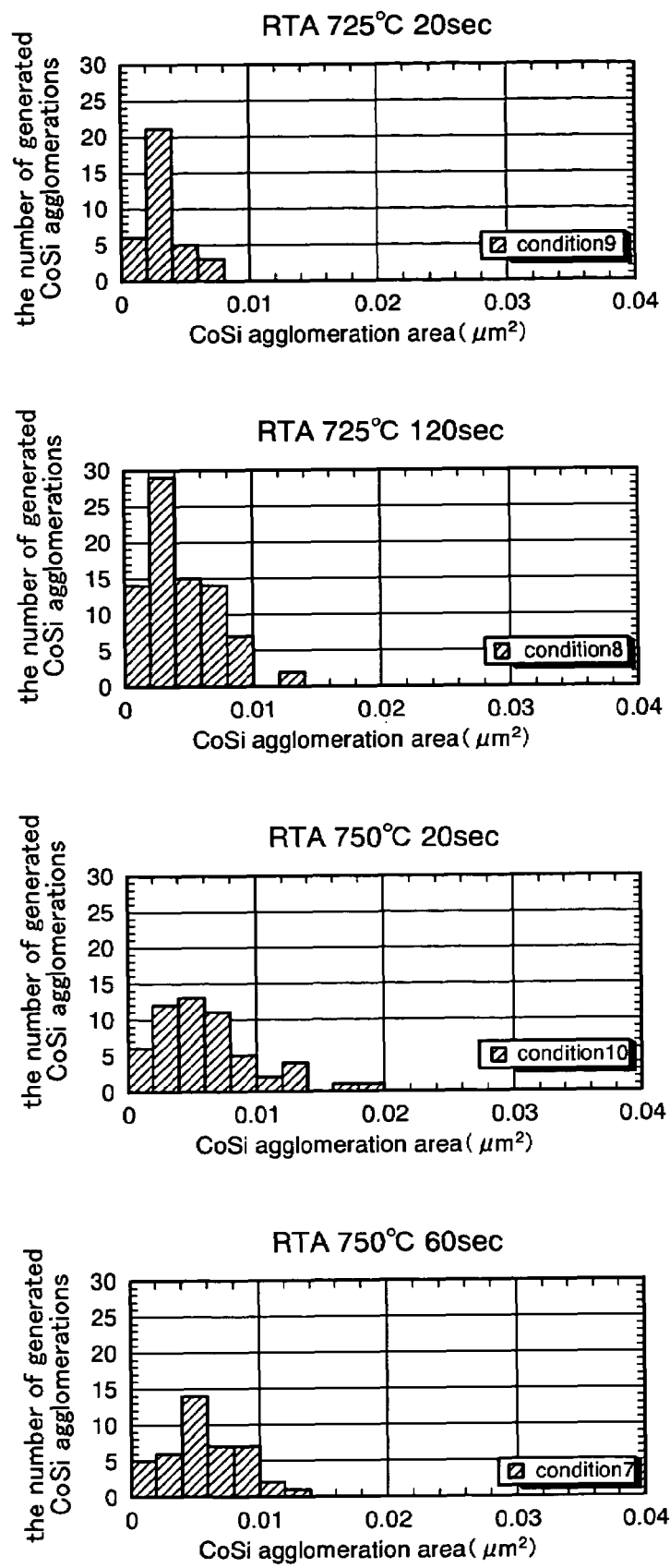
FIG. 7 shows histograms obtained by examining how the agglomeration area of the cobalt silicide layer is changed by the RTA temperature and the annealing time in the embodiment of the present invention.

It should be noted that like FIG. 5, the substrate temperature and the annealing time are indicated as the annealing conditions on the top of each histogram in FIG. 7.

As shown in FIG. 7, in the case of RTA, although the number of generated cobalt silicide agglomeration increased as the annealing time gets longer, agglomeration area was seldom changed by the annealing time. Furthermore, in contrast to the furnace annealing in FIG. 5, a distribution is located in a range where the agglomeration area is small, and a width of the distribution is narrow.

Figure 8:
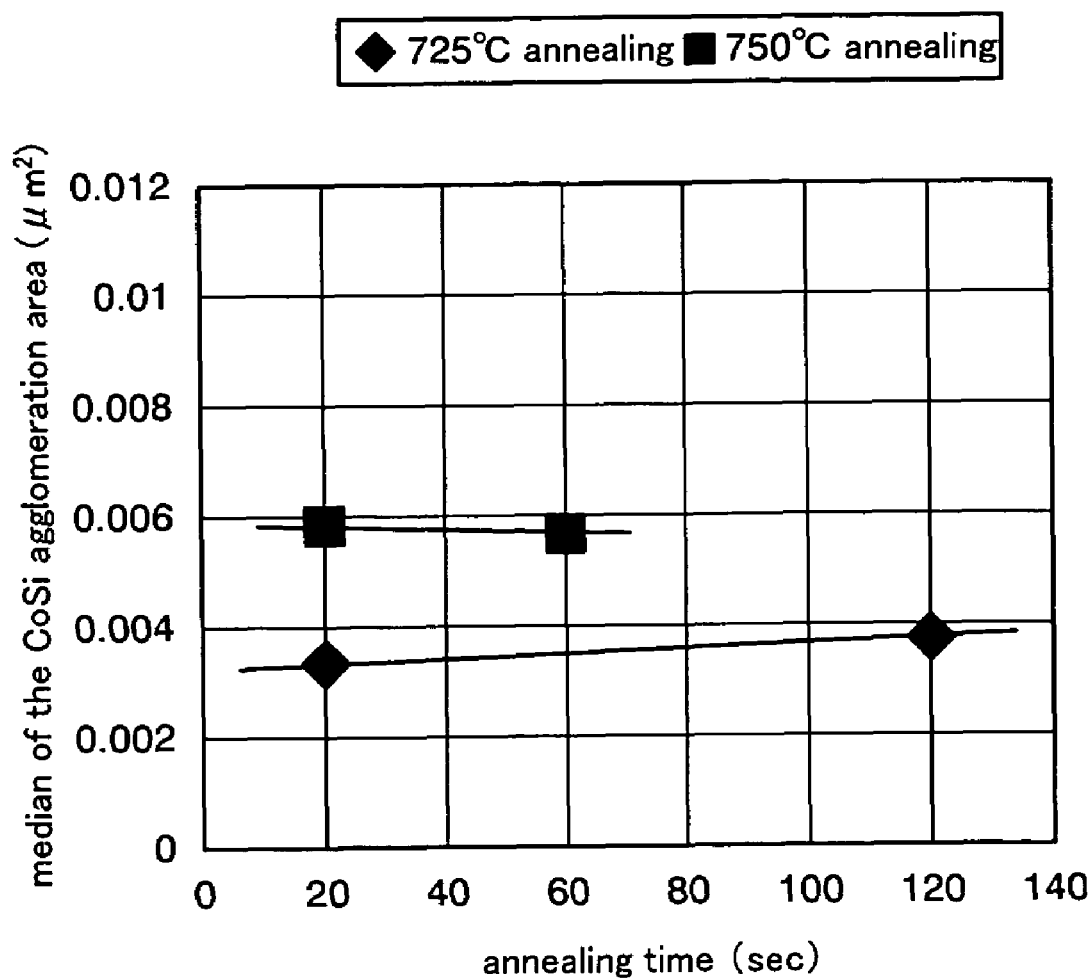
FIG. 8 is a graph obtained by examining a relationship between the agglomeration area of the cobalt silicide layer and the RTA annealing time in the embodiment of the present invention.

FIG. 8 is a graph obtained by examining a relationship between a median of the agglomeration area and the annealing time in respective samples, while using four samples used in FIG. 5.

As apparent from FIG. 8, in the case of RTA, an increasing tendency of the agglomeration area like the furnace annealing in FIG. 6 did not appear, and the agglomeration area was kept almost constant irrespective of the annealing time.

Moreover, it can also be seen from FIG. 8 that the agglomeration area can be reduced by reducing the annealing temperature in the RTA.

Next, the inventors of this application investigated what tendency appears in the agglomeration of the cobalt silicide layer when the furnace annealing and the RTA are applied in combination. Histograms thus obtained are shown in FIG. 9.

In this investigation, three samples similar to those explained in FIG. 2 were prepared, and the RTA was applied to one of them after the furnace annealing. Investigated result of the sample is given in the uppermost graph in FIG. 9, and the annealing conditions are indicated on the top of this graph. Also, the furnace annealing and the RTA were applied independently to two remaining samples respectively. These investigated results are given in the middle and lower graphs in FIG. 9. Meanings of an abscissa and an ordinate of the histogram in FIG. 9 are the same as those explained in FIG. 5 and FIG. 7, and their explanation will be omitted herein.

Figure 9:
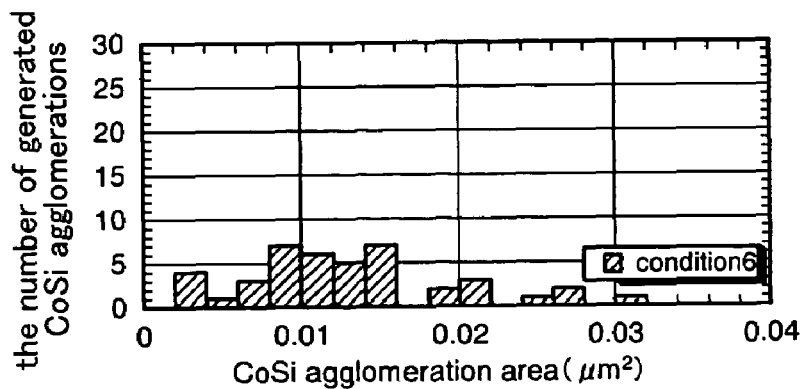
FIG. 9 shows histograms obtained by examining what tendency the agglomeration of the cobalt silicide layer exhibits when the furnace annealing and the RTA are applied together in the embodiment of the present invention.
Figure 9:
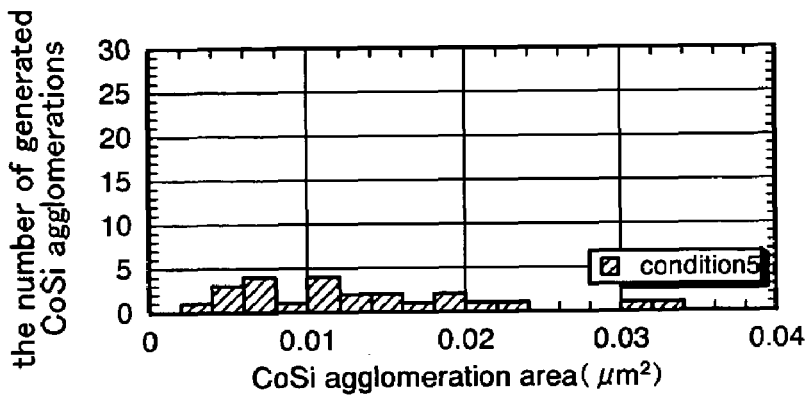
Figure 9:
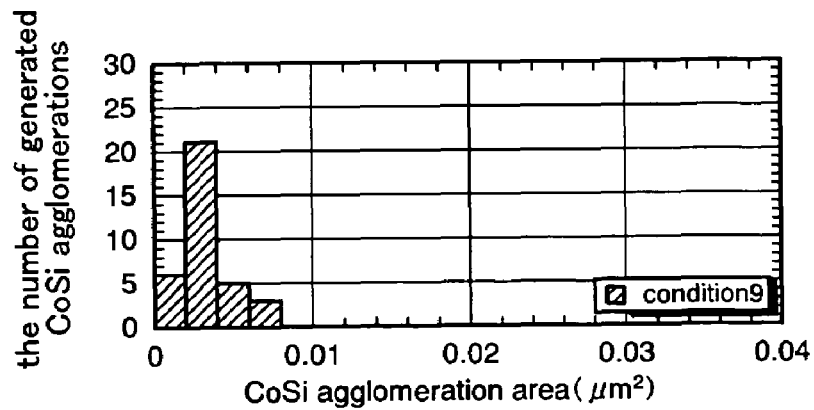

As shown in FIG. 9, the distribution in the uppermost graph in which the furnace annealing and the RTA are applied together was almost decided by the distribution of the furnace annealing shown in the middle graph, and was seldom affected by the distribution of the RTA in the lowermost graph.

It is evident from this result that the agglomeration area of the cobalt silicide layer and its distribution are decided by not the RTA corresponding to the crystallizing annealing but the furnace annealing corresponding to the recovery annealing.

Figure 10:
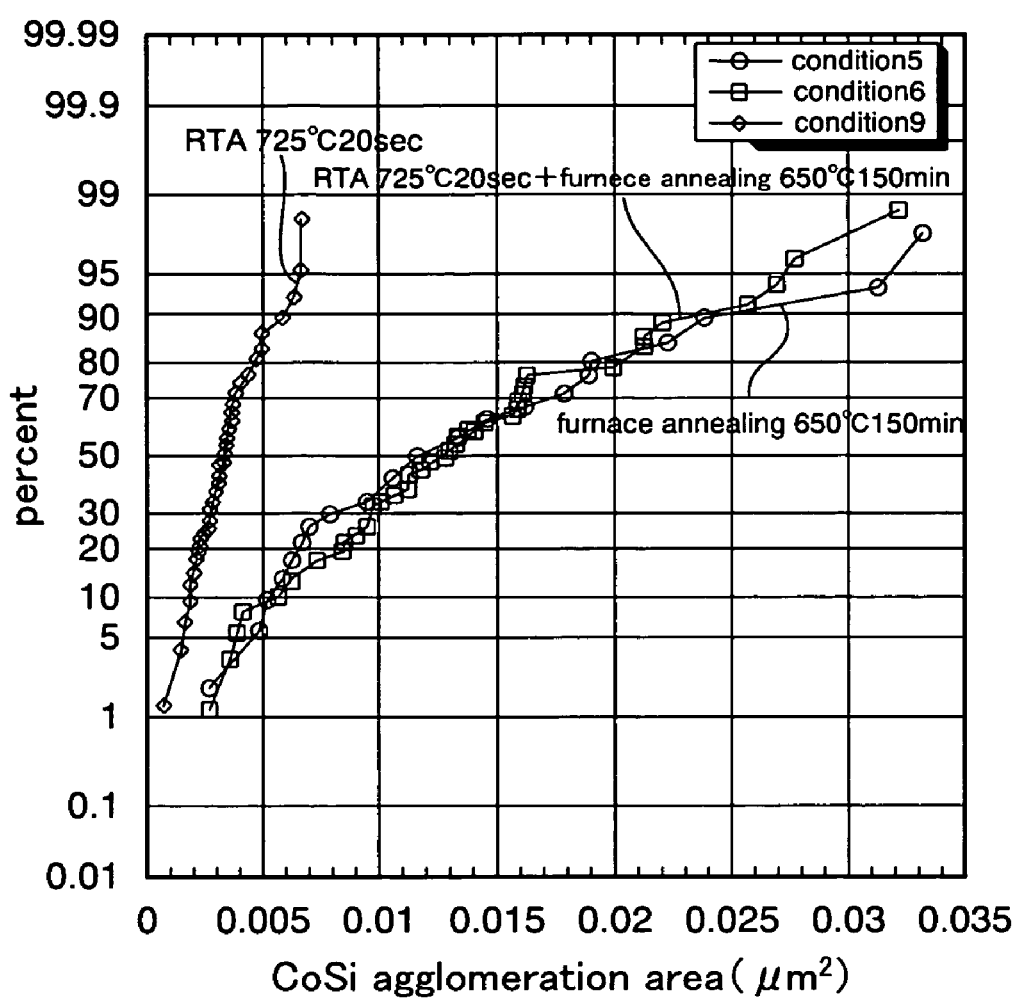
FIG. 10 is a graph obtained by calculating a cumulative probability of the agglomeration area of the cobalt silicide layer on the basis of three samples used in FIG. 9.

FIG. 10 is a graph obtained by calculating a cumulative probability of the agglomeration area of the cobalt silicide layer on the basis of three samples used in FIG. 9.

As shown in FIG. 10, most parts of a graph of the condition 6 in which the furnace annealing and the RTA are applied in combination overlapped with a graph of the condition 5 in which only the furnace annealing is applied, but was separated largely from a graph of the condition 9 in which only the RTA is applied. It can be confirmed from these results that the agglomeration area of the cobalt silicide layer is substantially decided by the furnace annealing.

From the foregoing results, it is verified from the comparison between the furnace annealing and the RTA that the furnace annealing used as the recovery annealing of the capacitor plays a major role in increasing the resistance of the cobalt silicide layer due to the agglomeration than the RTA.

It is considered that the resistance of the cobalt silicide layer is increased higher as its agglomeration area is increased larger. Since the agglomeration area depends linearly on the annealing time as shown in FIG. 6, it is expected that a reduction of the annealing time in the furnace annealing is effective in reducing the resistance of the cobalt silicide layer. In order to verify this respect, the inventors of this application prepared the sample in which a length and a width of the first refractory metal silicide layer 17a explained in FIGS. 1A to 1N are set to 75 µm and 0.24 µm respectively, and then measured a total resistance of the first refractory metal silicide layer 17a and the underlying first source/drain region 13a. The results are shown in FIG. 11.

Figure 11:
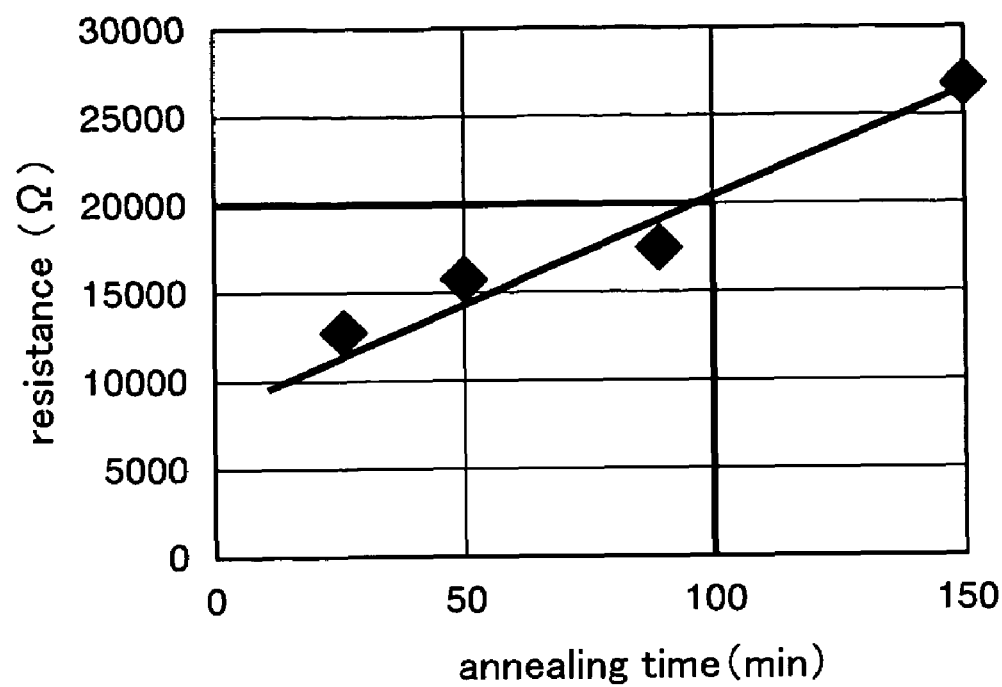
FIG. 11 is a graph obtained by examining a relationship between the annealing time of the furnace annealing and the resistance value of the cobalt silicide layer in the embodiment of the present invention.

As shown in a graph (second graph) of FIG. 11, the above resistance is almost proportional to the annealing time of the furnace annealing, and is increased as the annealing time gets longer. The reason for this may be considered such that the agglomeration area of the cobalt silicide layer 17a increases as the annealing time gets longer and thus the cobalt silicide layer 17a is disconnected by the agglomeration or is brought into the almost disconnected state.

If the resistance value increases in this manner, a voltage drop in the source/drain regions 13a of the MOS transistor is enhanced. As a result, for example, the voltage applied to the capacitor of the FeRAM is reduced, so that it becomes impossible to write/read the information into/from the capacitor. Since such problem is caused conspicuously when the total resistance of the cobalt silicide layer 17a and the source/drain regions 13a is in excess of 20000Ω, an upper limit value of the above resistance value is set to 20000Ω in the present embodiment.

According to FIG. 11, it can be seen that the annealing time of the furnace annealing should be set equal to or less than 100 minutes to get the resistance value of 20000 Ω or less. It should be noted that the upper limit of 100 minutes is the one suitable for the furnace used in the present embodiment. Therefore, upper limit of the annealing time, which makes the resistance value be equal to or less than 20000 Ω, can vary when another furnace is used.

Therefore, in the present embodiment, the agglomeration area of the cobalt silicide layer is employed as an absolute index rather than the annealing time. Referring to above-mentioned FIG. 6 (first graph), a median of the agglomeration area of the cobalt silicide layer is 0.008 µm$^2$ when the annealing time is its upper limit time of 100 minutes. For this reason, in order to attain the total resistance of the cobalt silicide layer and the underlying source/drain regions of 20000 Ω or less, the upper limit area of the agglomeration area should be set to 0.008 µm$^2$ or less.

By doing this, even when the furnace different from that in the present embodiment is employed, the first graph similar to FIG. 6 can be plotted by using such furnace and then the upper limit time of the annealing time corresponding to the upper limit area (0.008 µm$^2$) can be derived by using the first graph. Then, by applying the recovery annealing to the capacitor in the furnace within the annealing time that is equal to or shorter than the upper limit time thus obtained, the total resistance of the cobalt silicide layer and the source/drain region can be lowered equal to or less than the upper limit resistance value (20000 Ω), thus making it possible to avoid the disadvantage such as a reduction in the applied voltage of the capacitor Q and the like.

Figure 12:
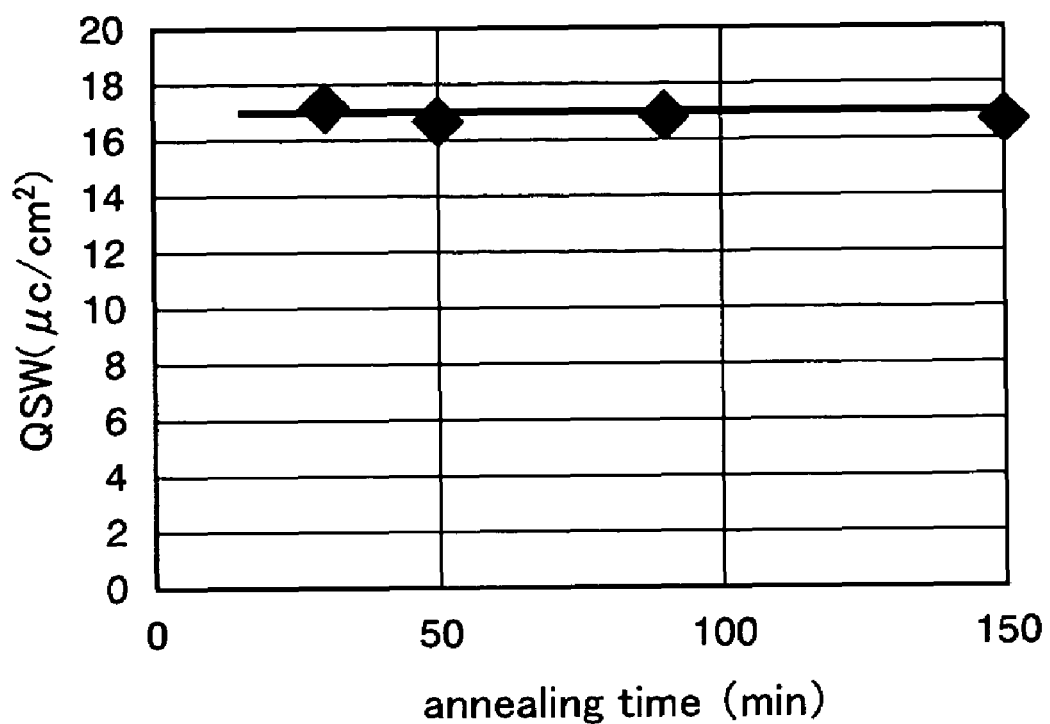
FIG. 12 is a graph obtained by examining a relationship between the RTA annealing time and the residual dielectric polarization charge of the capacitor in the embodiment of the present invention.

Meanwhile, it may be considered that, if the annealing time is limited in a range below the upper limit time as described above, an effect of the recovery annealing is reduced. In order to verify whether this is the case, the inventors of this application investigated a relationship between a residual dielectric polarization charge $Q_{SW}$ of the capacitor Q and the annealing time of the recovery annealing in the furnace. Results are shown in FIG. 12. In this examination, a size of the upper electrode 33a (see FIG. 11H) constituting the capacitor Q was set to a rectangle of 1.15 µm×2.10 µm.

As shown in FIG. 12, when the annealing time was set equal to or less than the upper limit time of 100 minutes, the residual dielectric polarization charge $Q_{SW}$ was not substantially changed and kept constant. Accordingly, it was verified that the concerned reduction in the effect of the recovery annealing is not generated, and that the characteristics of the capacitor Q is not largely affected even when the upper limit time of the annealing time is restricted.

Although the upper limit time of the annealing time of the recovery annealing using the furnace was derived in the above, the upper limit time may be derived by applying the similar approach to this to the crystallizing annealing by means of the RTA.

Furthermore, in the above, the agglomeration area of the cobalt silicide layer is lowered equal to or less than the upper limit area (0.008 µm$^2$) by providing the upper limit time of the annealing time. However, the present invention is not limited to this. As explained in FIG. 5, the agglomeration area of the cobalt silicide layer can also be reduced by decreasing the substrate temperature in the furnace annealing. Therefore, if the upper limit temperature of the substrate temperature in the furnace annealing is set in such a manner that the agglomeration area of the cobalt silicide layer becomes equal to or smaller than the upper limit area, and then the annealing is carried out at the temperature that is lower than the upper limit temperature, the above agglomeration can also be suppressed. This is also the case for the RTA performed as the crystallizing annealing.

According to the present invention, the annealing is carried out for the annealing time such that the agglomeration area of the refractory metal silicide layer is lowered equal to or less than the upper limit area. Therefore, it can be prevented that the resistance of the refractory metal silicide layer increases due to the increase in the agglomeration area at the time of annealing.

What is claimed is:

1. A semiconductor device manufacturing method, comprising:
   a step of forming a source/drain region of a MOS transistor in a partial area of a semiconductor substrate;
   a step of forming a refractory metal silicide layer on the source/drain region in the partial area of the semiconductor substrate;
   a step of forming an insulating film on the refractory metal silicide layer;
   a step of forming a first conductive film, a ferroelectric film, and a second conductive film in sequence on the insulating film;
   a step of forming a capacitor consisting of a lower electrode, a capacitor dielectric film, and an upper electrode by patterning the first conductive film, the ferroelectric film, and the second conductive film; and
   a step of performing an annealing with such a annealing time that an agglomeration area of the refractory metal silicide layer becomes equal to or less than an upper limit area;
   wherein the upper limit area is defined as an area in which a total resistance value of the refractory metal silicide layer and the source/drain region is equal to or lower than an upper limit resistance value.

2. A semiconductor device manufacturing method, according to claim 1, wherein an upper limit time of the annealing time corresponding to the upper limit area is derived by using a first graph showing a relationship between the agglomeration area of the refractory metal silicide layer and the annealing time, and then the annealing time is set equal to or less than the upper limit time.

3. A semiconductor device manufacturing method, according to claim 1, wherein a value of the agglomeration area corresponding to the upper limit resistance value is derived by using a first graph showing a relationship between the agglomeration area of the refractory metal silicide layer and the annealing time, and using a second graph showing a relationship between the annealing time and the total resistance value of the refractory metal silicide layer and the source/drain regions, and then the value thus derived is used as the upper limit area.

4. A semiconductor device manufacturing method, according to claim 3, wherein a median of areas of plural agglomerated portions generated in the refractory metal silicide layer is employed as the agglomeration area.

5. A semiconductor device manufacturing method, according to claim 4, wherein 0.008 µm$^2$ is employed as the upper limit area.

6. A semiconductor device manufacturing method, according to claim 1, wherein the step of performing the annealing is applied to the capacitor dielectric film by using a furnace after the capacitor dielectric film is formed.

7. A semiconductor device manufacturing method, according to claim 1, wherein the step of performing the annealing is performed by applying a rapid thermal annealing process to the ferroelectric film before the ferroelectric film is patterned.

8. A semiconductor device manufacturing method, according to claim 1, wherein the step of performing the annealing is performed in an oxygen containing atmosphere.

9. A semiconductor device manufacturing method, according to claim 1, wherein the step of forming the refractory metal silicide layer includes
   a step of forming a refractory metal layer on the source/drain region, and
   a step of forming the refractory metal silicide layer by annealing the refractory metal layer to cause the refractory metal layer to react with a semiconductor.

10. A semiconductor device manufacturing method, according to claim 1, wherein either a cobalt silicide layer or a nickel silicide layer is formed as the refractory metal silicide layer.

11. A method of manufacturing a semiconductor device, comprising:
   forming a source/drain region of a MOS transistor in a semiconductor substrate;
   forming a refractory metal silicide layer over the source/drain region;
   forming an insulating film over the refractory metal silicide layer;
   forming a first conductive film, a ferroelectric film, and a second conductive film in sequence on the insulating film;
   forming a capacitor consisting of a lower electrode, a capacitor dielectric film, and an upper electrode by patterning the first conductive film, the ferroelectric film, and the second conductive film; and performing an annealing, wherein a total resistance value of the refractory metal silicide layer and the source/drain region after the annealing is equal to or lower than 20 kΩ.

12. A method of manufacturing a semiconductor device, according to claim 11, wherein, in the step of forming the refractory metal silicide layer, the refractory metal silicide layer is formed on the source/drain region.

13. A method of manufacturing a semiconductor device, according to claim 11, wherein the step of performing the annealing is applied to the capacitor dielectric film by using a furnace after the capacitor dielectric film is formed.

14. A method of manufacturing a semiconductor device, according to claim 11, wherein the step of performing the annealing is performed by applying a rapid thermal annealing process to the ferroelectric film before the ferroelectric film is patterned.

15. A method of manufacturing a semiconductor device, according to claim 11, wherein the step of performing the annealing is performed in an oxygen containing atmosphere.

16. A method of manufacturing a semiconductor device, according to claim 11, wherein the step of forming the refractory metal silicide layer includes a step of forming a refractory metal layer on the source/drain region, and a step of forming the refractory metal silicide layer by annealing the refractory metal layer to cause the refractory metal layer to react with a semiconductor.

17. A method of manufacturing a semiconductor device, according to claim 11, wherein either a cobalt silicide layer or a nickel silicide layer is formed as the refractory metal silicide layer.

* * * * *